(12) United States Patent
Srinivasan et al.

(10) Patent No.: US 6,701,506 B1
(45) Date of Patent: Mar. 2, 2004

(54) METHOD FOR MATCH DELAY BUFFER INSERTION

(75) Inventors: Adi Srinivasan, Fremont, CA (US); David L. Allen, Fremont, CA (US)

(73) Assignee: Sequence Design, Inc., Santa Clara, CA (US)

( * ) Notice: Subject to any disclaimer, the term of this patent is extended or adjusted under 35 U.S.C. 154(b) by 145 days.

(21) Appl. No.: 10/022,743

(22) Filed: Dec. 14, 2001

(51) Int. Cl.[7] .................. G06F 17/50; H03H 11/26
(52) U.S. Cl. .................. 716/10; 716/1; 716/8; 716/9; 327/270; 703/14
(58) Field of Search ............ 716/10, 1–9; 327/270; 326/49; 703/14

(56) References Cited

U.S. PATENT DOCUMENTS

| | | | | |
|---|---|---|---|---|
| 5,724,250 A | * | 3/1998 | Kerzman et al. | 716/3 |
| 5,764,531 A | * | 6/1998 | Kojima et al. | 716/6 |
| 5,841,296 A | * | 11/1998 | Churcher et al. | 326/49 |
| 6,145,116 A | * | 11/2000 | Tawada | 716/6 |
| 6,347,393 B1 | * | 2/2002 | Alpert et al. | 716/2 |
| 6,421,784 B1 | * | 7/2002 | Chu et al. | 713/401 |
| 6,470,476 B2 | * | 10/2002 | Bednar et al. | 716/2 |
| 6,523,156 B2 | * | 2/2003 | Cirit | 716/9 |
| 6,553,338 B1 | * | 4/2003 | Buch et al. | 703/14 |
| 6,560,752 B1 | * | 5/2003 | Alpert et al. | 716/2 |
| 2001/0048333 A1 | * | 12/2001 | Fujii | 327/270 |
| 2002/0116690 A1 | * | 8/2002 | Lackey | 716/4 |
| 2002/0178427 A1 | * | 11/2002 | Ding et al. | 716/12 |

* cited by examiner

Primary Examiner—Matthew Smith
Assistant Examiner—Magid Y Dimyan
(74) Attorney, Agent, or Firm—Edward C. Kwok; MacPherson Kwok Chen & Heid LLP

(57) ABSTRACT

A method for "match-delay" buffer insertion is provided to add delays at a node without changing the input capacitance of the node as seen by the upstream node. In one embodiment, a method for inserting a delay in a node in an electrical design associated with a logic gate includes: adding the delay at the node by adding a new logic gate before the node where the new logic gate is the same cell type as the logic gate and is positioned near the logic gate. The method may further include: determining if the delay can be added by adding a new logic gate before the node, and if a new logic gate cannot be added before the node, adding the delay by adding a new logic gate after the logic gate where a combination of the logic gate and the new logic gate giving the delay to be added.

5 Claims, 16 Drawing Sheets

The H-Tree
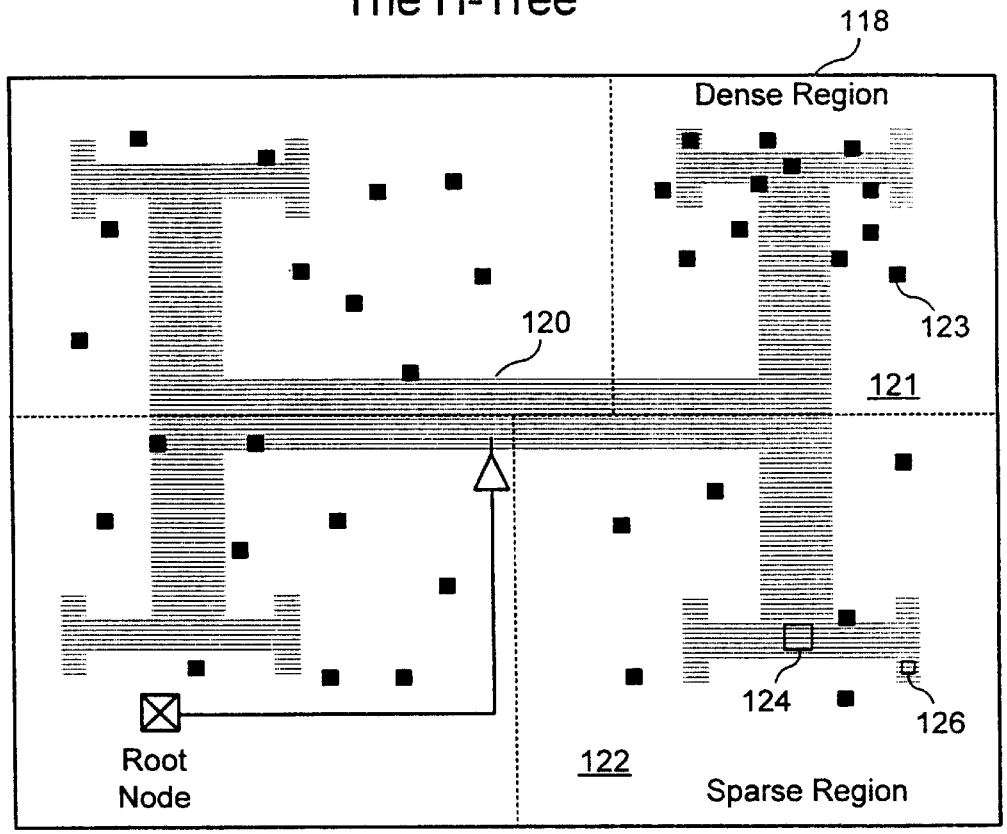
_Figure 2_ (Prior Art)
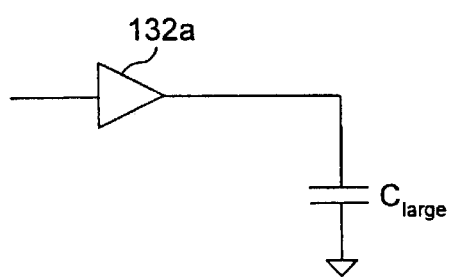
_Figure 3a_
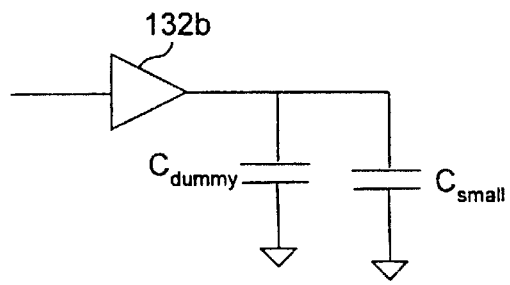
_Figure 3b_

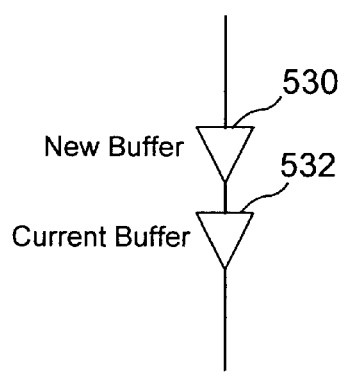
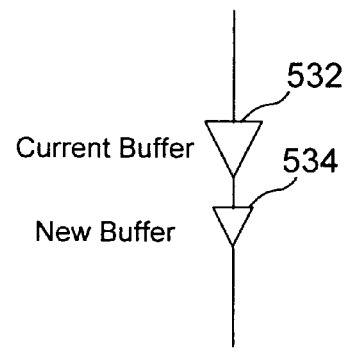
*Figure 20a*  *Figure 20b*

METHOD FOR MATCH DELAY BUFFER INSERTION

CROSS-REFERENCE TO RELATED APPLICATION

The present application is related to the following concurrently filed and commonly assigned U.S. patent applications Ser. No. 10/023,329, entitled "Method for Balanced-Delay Clock Tree Insertion," by A. Srinivasan and D. Allen, Ser. No. 10/022,751, entitled "Method for Match Delay Buffer Insertion," by A. Srinivasan and D. Allen and Ser. No. 10/022,747, entitled "Method for Optimal Driver Selection," by A. Srinivasan.

BACKGROUND OF THE INVENTION

1. Field of the Invention

The invention relates to a system and method for integrated circuit design, and more particularly to a system and method for inserting a clock tree in an integrated circuit design.

2. Description of the Related Art

A standard cell-based integrated circuit is designed using a library of building blocks, known as "standard cells." Standard cells include such elements as buffers, logic gates, registers, multiplexers, and other logic circuits ("Macros").

FIG. 1 shows a typical design process or "design flow" 100 that an integrated circuit designer would use to design a standard cell-based integrated circuit. Referring to FIG. 1, the designer provides a functional or behavioral description (101) of the integrated circuit design using a hardware description language (HDL). In addition, the designer specifies timing and other performance constraints which the integrated circuit design must comply. The designer also selects a standard cell library to implement the design. Typically, the standard cells in the library are designed to the requirements of a target integrated circuit fabrication technology. Often, each cell is also characterized in the library to provide performance parametric values such as delay, input capacitance and output drive strength.

At step 102, the designer uses a "synthesis tool" to create from the HDL description 101 a functionally equivalent logic gate-level circuit description known as a "netlist" (103). The elements of the netlist are instances of standard cells selected by the synthesis tool from the standard cell library in accordance with functional requirements and the performance constraints.

Next, a place and route tool is used to create a "physical design" based on the gate-level netlist (103). The place and route tool uses a physical library 104 containing the physical design of the standard cells in the standard cell library. In operation, the place and route tool places the standard cell instances of the netlist onto the "silicon real estate" and routes conductor traces ("wires") among these standard cell instances to provide for interconnection. Typically, the placement and routing of these standard cell instances are guided by cost functions, which minimize wiring lengths and the area requirements of the resulting integrated circuit.

At step 105, an initial placement of the integrated circuit design is performed and a placement file 106 is generated containing the placement information of all standard cell instances of the design. In design flow 100, after the initial placement, certain pre-route optimization is performed to ensure that the current placement meets the timing constraints imposed by the design (step 107). Physical optimization operates by recursively performing timing analysis, detecting timing violations and performing corrections (such as by introducing delays or by speeding up a signal path). The physical optimization tasks generally include correcting maximum delay violations and minimum delay violations. After the physical optimization is completed, a modified netlist 108 and a modified placement file 109 are generated.

Then, at step 110, a clock tree for the integrated circuit design is created and inserted into the design. Most integrated circuit designs, such as those employing sequential logic, are driven by one or more clock signals. In the functional or behavior description of the design, the clock signal is merely represented as a wire distributing the clock signal from a clock input terminal to all nodes within the integrated circuit design receiving the clock signal. In the present description, nodes within an integrated design driven by the clock signal is referred to as "clock signal endpoints" or "clock endpoints." A clock endpoint is typically an electrical terminal or a "pin" of a standard cell instance. The clock tree insertion step (110) operates to transform the wire representing the clock signal into a buffer tree so that the clock signal from the input terminal can drive all endpoints within the timing constraints of the design. The clock tree insertion step generates a modified netlist 112 including the buffers of the clock tree and a modified placement file 113 including the placement information of the buffers in the clock tree.

After physical optimization is performed and the clock tree is inserted, the placement of the integrated circuit can be legalized. Then, at step 114, the design can be routed so that all standard cell instances, including the clock tree, are connected with conductor traces (wires). Subsequently, a design verification step 115 is carried to ensure that the design meets the timing constraints specified for the overall design For instances, with the wires of the integrated circuit routed, a more accurate set of parasitic impedance values in the wires can be extracted. Using the extracted parasitic impedance values, a more accurate timing analysis can be run at step 115 using a static timing analyzer (STA). If the physical design meets timing constraints, the design process is complete. Otherwise, steps 105 to 114 are repeated after appropriate modifications are made to the netlist and the performance constraints.

As described above, the clock tree insertion step operates to transform the wire carrying the clock signal into a buffer tree propagating the clock signal from the clock input terminal throughout the design subject to certain predefined timing constraints. The timing constraints basically ensure that all clock signals arrive at about the same time at different nodes of the integrated circuit receiving the clock signal. In general, timing constraints for a clock tree include the maximum and minimum insertion delay time, the clock skew and the clock transition time.

Techniques for constructing a clock tree are well known. The prevalent method used in integrated circuit design is the construction of an "H-Tree." FIG. 2 illustrates an exemplary H-Tree in an integrated circuit for distributing the clock signal. The principle behind constructing an H-tree is to distribute the clock signal so as to balance the loading of the clock tree. Referring to FIG. 2, an integrated circuit 118 is shown including multiple number of clock signal endpoints scattered throughout the integrated circuit. For example, an endpoint 123 denotes one of the many clock endpoints of integrated circuit 118. FIG. 2 is an abstract representation of integrated circuit 118 and is provided to illustrate the positions of the clock endpoints in the integrated circuit. As mentioned above, an endpoint of a clock signal is the electrical terminal or the pin of a standard cell instance receiving the clock signal.

The clock signal is coupled to integrated circuit 118 through a root node. In FIG. 2, an H-tree 120 is constructed connecting the clock signal from the root node to the clock endpoints. Typical H-tree construction starts by dividing the integrated circuit into regions, each region containing a number of endpoints. In FIG. 2, four regions are defined. Then, an approximate center of each region is determined and the center is used as a point for buffer insertion. For example, a buffer insertion point 124 in a region 122 (the lower-right region) of integrated circuit 118 is identified. Then, each region is further divided and the approximate center is identified to define buffer insertion points at the next level of the H-tree. For example, a buffer insertion point 126 is identified for a sub-region within region 122. H-tree 120 can be recursively refined to a required level in order to drive all endpoints within the predefined timing constraints.

The benefits of using an H-tree for clock distribution is that, by recursively building the H-tree, the same wire distance can be maintained between the root node to any of the endpoints. When distance is used as a proxy for load capacitance, equal distance means equal load capacitance at each endpoint. Because insertion delay of the clock signal at any endpoint is directly proportional to load capacitance, the H-tree is constructed so that the clock signal delay to any of the endpoints is approximately the same. In this manner, the H-tree methodology constructs a clock tree meeting the timing constraints.

In the construction of the H-tree, the same buffer is used at each buffer insertion point to ensure balanced loading. Thus, another benefit of the H-Tree is that the integrated circuit design tends to be more stable across fabrication process variations and operational environment variations (such as temperature) because the same buffers are used.

However; the H-tree methodology for constructing a clock tree has several disadvantages. First, it is difficult to construct an H-tree to balance the loading between a region with dense endpoints and a region with sparse endpoints. Often, in an effort to achieve balanced load through balanced distance, the H-tree methodology may unnecessarily add extra loading to the sparse regions. The extra loading effectively increases the total loading of the clock tree, creating a clock tree that is "larger" than necessary.

Referring to FIG. 2, region 122 of integrated circuit 118 may be a sparse region containing few clock signal endpoints. On the other hand, a region 121 above region 123 may be a dense region containing many more clock signal endpoints. Because the H-tree is optimized to achieve balanced load by balancing the wire distance, the same size and same amount of buffers will be used to drive endpoints in both the dense and the sparse regions. However, in the dense region, the buffers need to drive a large number of endpoints while in the sparse region, the buffers only need to drive a small number of endpoints.

FIGS. 3a and 3b illustrate the situations when an H-tree is used to drive endpoints in a dense region and in a sparse region. In FIG. 3a, a buffer 132a is in a dense region and thus has to drive a large number of endpoints, represented by a capacitor $C_{large}$. In FIG. 3b, a buffer 132b, same type of buffer as buffer 132a, is in a sparse region and thus has to drive only a small number of endpoints, represented by a capacitor $C_{small}$. When $C_{large}$ is much greater than $C_{small}$, the H-tree is not balanced because the same buffers (132a and 132b) are driving different loads. The common solution to the dense/sparse regions problem in constructing an H-tree is to add dummy load to buffers in the sparse region so that the clock tree is balanced. Referring to FIG. 3b, a dummy load, represented by capacitor $C_{dummy}$ is added in parallel to capacitor $C_{small}$ so that the total capacitance of the two capacitors equals the capacitance of $C_{large}$.

Because of the addition of the dummy load, the clock tree is made larger for driving a larger load created merely for the purpose of balancing the loading of the clock tree. As a result, the clock tree tends to be slower because the clock tree has to drive a large amount of load. Thus, the H-tree methodology trades off clock insertion delay for the entire tree in order to gain a clock tree with balanced load. Furthermore, a larger clock tree requires more silicon area to implement, resulting in increased manufacturing cost.

Second, balancing the load does not always imply balancing the insertion delay of the clock signal. The H-tree methodology assumes a linear, proportional relationship between wire distance and load. However, a small change in wire distance may translate into a large change in load capacitance. Therefore, by using wire distance as proxy for loading in constructing the clock tree, unpredictable clock signal delays may result.

As integrated circuit dimensions continue to shrink, the aforementioned disadvantages and tradeoffs in clock tree constructions become unacceptable. Therefore, it is desirable to provide an improved method for clock tree construction which can avoid the aforementioned deficiencies so that a clock tree can be constructed and optimized to meet timing constraints.

SUMMARY OF THE INVENTION

According to one embodiment of the present invention, a method for "match-delay" buffer insertion is provided to add delays at a node without changing the input capacitance of the node as seen by the upstream node (or the parent node).

In one embodiment, a method for inserting a delay in a node in an electrical design associated with a logic gate is described. The method ensures that the input capacitance as seen by a parent node to the node is maintained. The method includes: adding the delay at the node by adding a new logic gate before the node where the new logic gate is the same cell type as the logic gate and is positioned near the logic gate. In another embodiment, the method further includes: determining if the delay can be added by adding a new logic gate before the node, and if a new logic gate cannot be added before the node, adding the delay by adding a new logic gate after the logic gate where a combination of the logic gate and the new logic gate giving the delay to be added.

The present invention is better understood upon consideration of the detailed description below and the accompanying drawings.

BRIEF DESCRIPTION OF THE DRAWINGS

FIG. 2 illustrates an exemplary H-Tree in an integrated circuit for distributing the clock signal.

FIGS. 3a and 3b illustrate the situations when an H-tree is used to drive endpoints in a dense region and in a sparse region of clock signal endpoints.

FIGS. 20a and 20b illustrate the operation of the match-delay buffer insertion method of the present invention.

In the present disclosure, like objects which appear in more than one figure are provided with like reference numerals.

DETAILED DESCRIPTION OF THE PREFERRED EMBODIMENTS

In accordance with the principle of the present invention, a clock tree insertion system constructs a clock tree in an electrical design, such as an integrated circuit design, using a balanced delay approach so that a fast clock tree with predictable delay can be realized. First, the clock tree insertion system constructs a clock tree to minimize the worst insertion delay to any clock endpoint. Then, the clock tree insertion system introduces delays at the nodes with the fastest clock arrival time to ensure that the clock tree will meet target clock skew and target minimum delay constraints. A clock tree thus constructed has delay and skew values that can meet tighter timing constraints. Also, by balancing the delay directly, the clock tree insertion system can generate a clock tree with predictable delay and improved stability. Furthermore, the clock tree is optimized without the need to introduce dummy loads. Therefore, a clock tree constructed according to the clock tree insertion system of the present invention consumes less silicon area and less power in operation.

The clock tree insertion system can be incorporated into any integrated circuit design flow such as design flow 100.

Design flow 100 is illustrative only and the clock tree insertion system of the present invention can be applied in other design flows for designing an integrated circuit. In one embodiment, the clock tree insertion system is applied in an integrated circuit design flow using an interconnect-driven optimization process and incremental place and route for physical design modification. Such a design process is described in copending and commonly assigned U.S. patent application Ser. No. 09/516,489, entitled "Method And Apparatus For Interconnect-Driven Optimization of Integrated Circuit Design," of Douglas Kaufman et al., filed Mar. 1, 2000, which patent application is incorporated herein by reference in its entirety. Basically, the clock tree insertion system and method can be applied to any integrated circuit design flow for transforming a clock signal, represented as a wire in an integrated circuit design, to a buffer clock tree based on specified timing constraints.

Clock Tree Insertion System Overview

Figure 4:
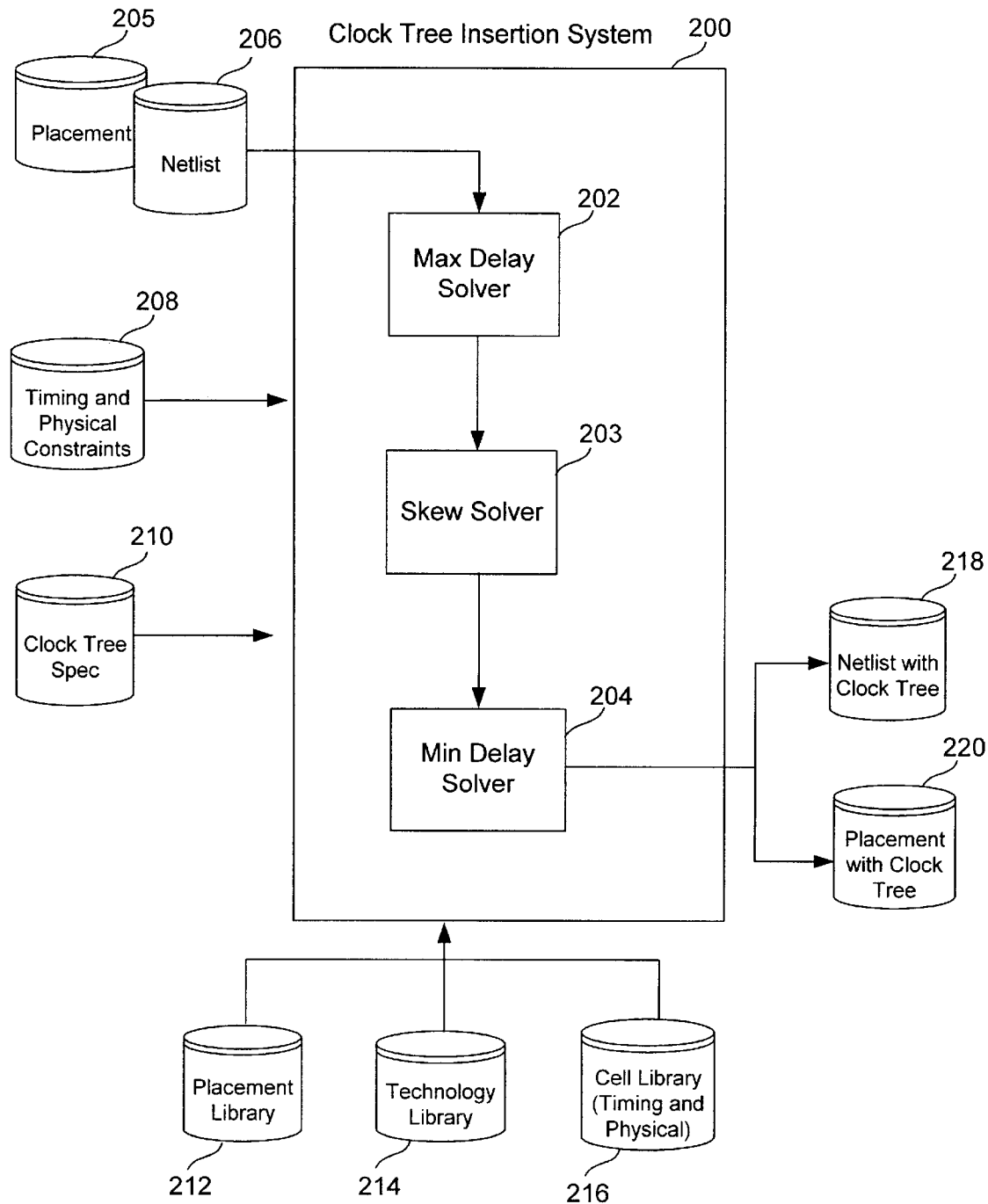
FIG. 4 is a block diagram of a clock tree insertion system according to one embodiment of the present invention.

FIG. 4 is a block diagram of a clock tree insertion system according to one embodiment of the present invention. Referring to FIG. 4, clock tree insertion system 200 includes a max delay solver module 202, a skew solver module 203 and a min delay solver module 204. Clock tree insertion system 200 can be implemented on a computer, such as a SPARC station available from Sun Microsystems, Inc., Palo Alto, Calif. In the present embodiment, a designer interacts with system 200 using a graphical user interface (GUI) (not shown). Of course, other means for interacting with clock tree insertion system 200 can be used, such as using operating system level commands including UNIX command line, as is well known in the art.

Clock tree insertion system 200 receives four categories of input files. First, system 200 receives information describing an integrated circuit design to be processed. The integrated circuit design can be presented in the form of a netlist 206 and a placement file 205 generated from the netlist. The netlist and placement files can be expressed in any standard industry format, such as the LEF and DEF file formats supported by Synopsys, Inc. Netlist file 206 includes connection information for one or more clock signals driving the integrated circuit design. As described above, prior to clock tree insertion, the clock signal is represented in the netlist merely as a single wire connecting a clock input terminal receiving the clock signal to all of the clock endpoints associated with that clock signal.

Clock tree insertion system 200 also receives a specification 208 defining the timing and physical constraints for the integrated circuit design. The timing and physical constraints can be expressed in any standard industry format, such as those formats used in the "Primetime" tool from Cadence Design Systems, Inc. The timing constraints in specification 208 include the overall timing constraints for the design. The timing constraints can include required arrival time, required delay time and transition time of the signals in the design. The physical constraints describe where instances of standard cells can be placed in the integrated circuit, that is, the locations of the rows for cell placement and the locations of the routing channels. The physical constraints also specify the locations of obstructions, if any, for cell placement in the integrated circuit design. An obstruction can include a Macro element such as a memory block where a standard cell instance cannot be placed.

Clock tree insertion system 200 further receives a clock tree specification 210 defining the characteristics of the clock tree to be constructed and included in the integrated circuit design. Details of clock tree specification 210 will be described in more detail below.

Finally, clock tree insertion system 200 utilizes a number of library files providing information describing the technology used to fabricate the design and the standard cells that are available for constructing the clock tree. In the present embodiment, system 200 receives a placement library 212 including floorplan information for the integrated circuit design. Placement library 212 specifies the global physical constraints for the integrated circuit design as defined by the fabrication process. For example, placement library 212 defines locations where power buses for the integrated circuit are to be placed and locations for placing the standard cells.

System 200 also receives a technology Library 214 specifying the fabrication process to be used for the design. Technology library 214 defines the properties of the different layers (metal and polysilicon) in the fabrication process, including the electrical characteristics such as resistance per unit length and capacitance per unit length of each layer.

Finally, system 200 receives a cell library 216 including the timing and physical information for each standard cell in the library. The physical information describes, among other things, where the input/output terminals (pins) are at the boundary of each standard cell. The timing information describes, among other things, the timing delay through the cell, and the output signal transition time as a function of output loading.

Clock tree insertion system 200 operates to construct a buffer tree for distributing the clock signal throughout the integrated circuit design within specified timing constraints. Clock tree insertion system 200 generates as output files a modified netlist 218 including the buffers forming the clock tree and a modified placement file 220 including the placement of the buffers of the clock tree in the integrated circuit design.

In the present description, a clock tree is described as a "buffer tree" including an array of buffers as the drive elements of the clock signal. In actual implementation, the buffer tree can be constructed using non-inverting buffers (generally referred to as "buffers") or inverting buffers (generally referred to as "inverters"), or a combination of both, as long as the polarity of the clock signal is maintained. One of ordinary skill in the art would appreciate that any buffer in a clock tree can be replaced by a pair of inverters and vice versa. In the following description, the drive elements of a clock tree will be referred to as "buffers" exclusively. However, it is understood that "buffers" in the present description can include both non-inverting buffers (buffers) or inverting buffers (inverters). Basically, buffers and inverters can be used interchangeable in constructing a clock tree as long as the polarity of the clock signal is maintained.

Furthermore, in the present description, the integrated circuit design is assumed to have one clock signal only and clock tree insertion system 200 is used to insert one clock tree to distribute the single clock signal. However, in other embodiments, the integrated circuit design may include more than one clock signal. Clock tree insertion system 200 can be used to insert one or more clock trees for one or more corresponding clock signals in an integrated circuit design. The several clock trees can be constructed simultaneously or the clock tree insertion system can be repeatedly applied to construct one clock tree at a time. The present description involving constructing one clock tree is illustrative only.

Clock Tree Insertion Process

Figure 5:
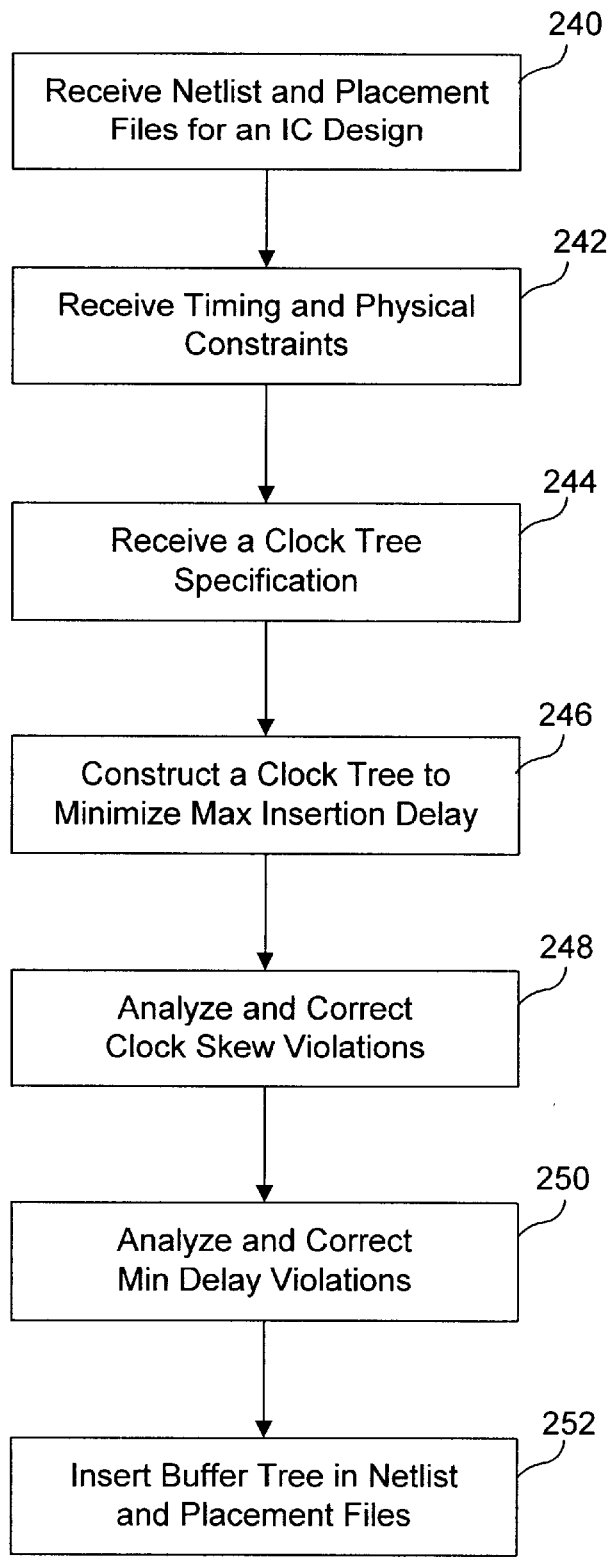
FIG. 5 is a flow chart illustrating the clock tree insertion process employed by the clock tree insertion system of FIG. 4 according to one embodiment of the present invention.

FIG. 5 is a flow chart illustrating the clock tree insertion process employed by clock tree insertion system 200 according to one embodiment of the present invention. The clock tree insertion system and process will be described with reference to FIGS. 4 and 5. Referring to FIG. 5, at step 240, clock tree insertion system 200 receives a netlist file (206) and a placement file (205) for an integrated circuit design. At step 242, clock tree insertion system 200 receives a specification (208) defining the timing and physical constraints for the integrated circuit design. At step 244, clock tree insertion system 200 receives a clock tree specification (210) defining parameters for the clock tree to be inserted into the integrated circuit design.

As described above, system 200 also utilizes a number of library files including placement library 212, technology library 124, and cell library 216. These library files can be made available to system 200 each time a design is processed or the library files can be made continuously available to clock tree insertion system 200 while system 200 processes a number of integrated circuit designs for constructing clock trees therein. Therefore, in one embodiment, the process flow in FIG. 5 may further include the step of providing the library files to system 200. In other embodiments, system 200 can access the library files continuously.

Clock Tree Specification

Figure 6:
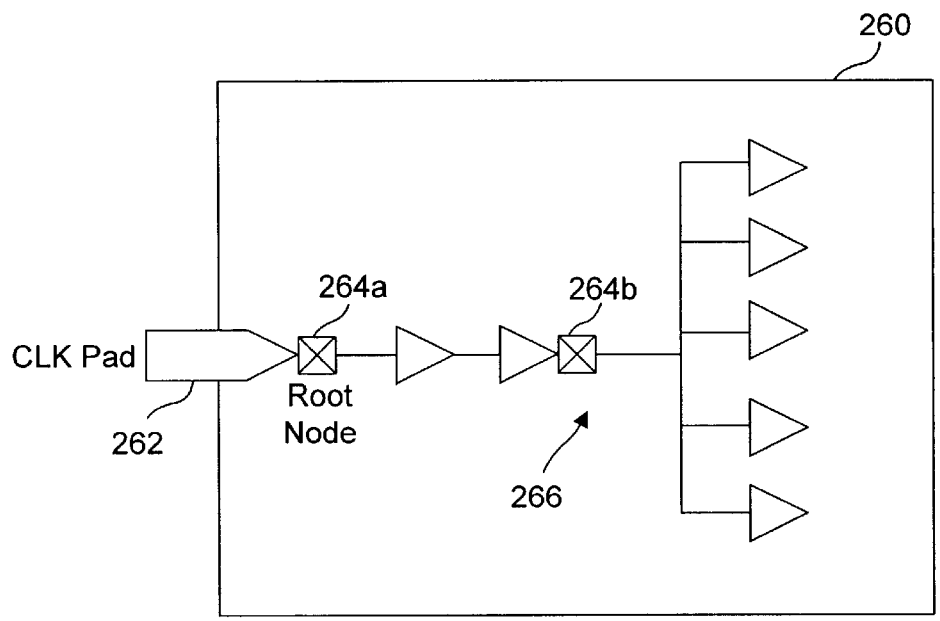
FIG. 6 illustrates an integrated circuit including two conventional locations for a root node of a clock tree.

To construct a clock tree in an integrated circuit design, the designer specifies the logical connections of the clock signal which is represented in the netlist as a wire connecting a clock signal to a number of clock signal endpoints. The designer also provides a clock tree specification (step 244 of FIG. 5) defining parameters for the clock tree to be constructed so that the clock signal can be distributed throughout the integrated circuit within specified timing constraints. The format and content of a clock tree specification are well known and typically includes one or more of the following parameters:

(1) Root Node—The designer specifies the location of the "root node" for the clock tree. The "root node" is defined as the starting point for the insertion of the clock tree. FIG. 6 illustrates two conventional locations for a root node of a clock tree. Referring to FIG. 6, integrated circuit 260 is illustrated with a clock input terminal (CLK pad) 262 receiving the clock signal and a clock tree 266. FIG. 6 illustrates two conventional locations for placing the root node. First, the root node of clock tree 266 can be located at the clock input terminal as shown by root node 264a. Second, the root node of clock tree 266 can be located at an output terminal of a logic block from which the clock signal is derived, as shown by root node 264b.

When the root node is not placed at the clock input terminal of an integrated circuit design, the conventional clock tree specification typically limits the placement of the root node at an output terminal of a logic gate (such as root node 264b). This placement limitation can be undesirable because the insertion of a clock tree at the output terminal of a logic gate can change the delay of the logic gate due to the loading introduced by the clock tree. Therefore, the delay of the clock signal can change depends on the size and loading of the clock tree that is inserted at root node 264b.

Figure 7:
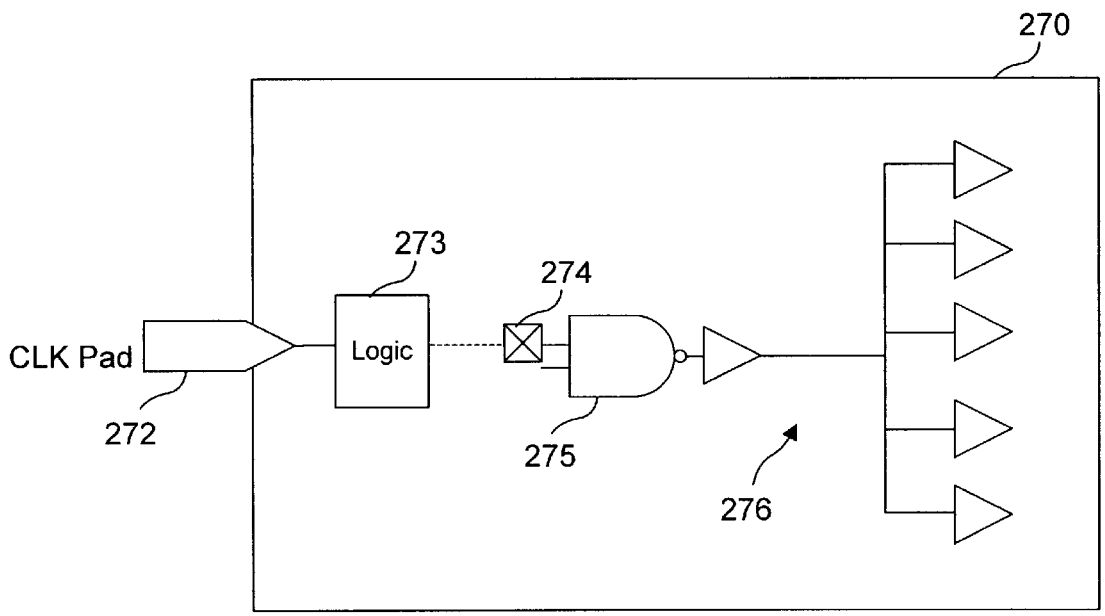
FIG. 7 illustrates a root node of a clock tree specified according to one embodiment of the present invention.

In accordance with the present invention, system 200 allows a designer to specify the location of a root node of a clock tree at an input terminal of a logic gate. FIG. 7 illustrates a root node of a clock tree specified according to one embodiment of the present invention. Referring to FIG. 7, an integrated circuit 270 includes a clock input terminal 272 receiving a clock signal. The clock signal is coupled to a logic block 273 deriving the clock signal. A root node 274 for a clock tree 276 constructed for integrated circuit 270 can be specified at an input terminal of an NAND gate 275. In this manner, the insertion of clock tree 276 will not change the delay of the clock signal at root node 274.

As mentioned above, an integrated circuit design may include one or more clock signals. When an integrated circuit design includes two or more clock signals, a root node is specified for each clock signal. Furthermore, the designer may specify more than one root node for each clock signal so that two or more clock trees can be constructed for a single clock signal.

(2) Buffer List—The designer specifies in the clock tree specification a list of buffers (a buffer set) and inverters which can be used to build the clock tree. The buffer set can be a subset of the buffers and inverters that are available in cell library 216. The list generally includes buffers and inverters of a variety of sizes and drive strength.

(3) Timing Specification—The designer must specify the timing constraints for the clock tree. Typically, the timing constraints includes the minimum insertion delay (min delay), the maximum insertion delay (max delay), the maximum clock signal transition time (max trans) and the maximum clock skew (max skew) of the clock signal.

The minimum insertion delay requirement specifies the smallest delay time for the clock signal to travel from the root node to any endpoint. That is, when the clock tree is constructed, the arrival time of the clock signal at any endpoints in the clock tree must be equal to or greater than min delay.

The maximum insertion delay requirement specifies the largest delay time for a clock signal to travel from the root node to any endpoint. That is, when the clock tree is constructed, the arrival time of the clock signal at any endpoints in the clock tree must be equal to or less than max delay.

The maximum clock signal transition time requirement imposes limitations on the transition time or edge rate of the clock signal at any endpoint of the clock tree. Thus, at any endpoint of the clock tree, the transition time for the falling or rising edge of the clock signal must be equal to or faster than max trans.

The maximum clock skew requirement specifies the maximum difference (the clock skew) between the slowest arrival time and the fastest arrival time of the clock signal in the clock tree. Thus, the clock skew of the clock tree must be equal to or less than max skew.

In accordance with an embodiment of the present invention, clock tree specification 210 provided to clock tree insertion system 200 includes additional parameters described below. The additional parameters described below are optional and are included to aid in the construction of the clock tree.

(4) Input Terminal Drive Strength—In accordance with the present invention, when the root node specified is at the input terminal of the clock signal (such as root node 264a in FIG. 6), the clock tree specification of the present invention allows the designer to also specify a driving cell at the input terminal and specify the drive strength of the driving cell. In one embodiment, the driving cell is specified by including the driving cell in the netlist. In another embodiment, the driving cell is specified by incorporating the characteristics of the driving cell in the specification of the input terminal.

The advantage of specifying a driving cell for a root node at an input terminal is to allow a realistic representation of the input terminal to be included in the clock tree specification. In conventional cell libraries, the input terminal is treated as an ideal terminal which is capable of driving an infinite length of wire. In other words, the input terminal is modeled as a perfect voltage source with zero output resistance. However, in actual implementation, the input terminal, including a buffer and other input protection circuits, actually has finite drive strength and non-zero output resistance. Therefore, by specifying the drive strength of a clock input terminal when the input terminal is the root node, clock tree insertion system 200 is better able to construct a clock tree appropriate for the drive capability of the input terminal.

(5) Heuristics—The designer may also specify various heuristics for use in the clock tree insertion process. For example, the designer may specify the distance measure to be used. Distance measurements commonly used in integrated circuit designs include the Euclidean system, the rectilinear (Manhattan) system and the sigma (statistical) system. In accordance with one embodiment of the present invention, a hybrid system representing a mix of the Euclidean and rectilinear systems may be used.

Construct a Clock Tree

Returning to FIG. 5, after step 244, clock tree insertion system 200 has enough information to proceed with constructing a clock tree for the integrated circuit design. In the present embodiment, the clock tree insertion process consists of three steps. First, a clock tree is constructed connecting the root node to all clock endpoints where the clock tree is constructed to minimize the maximum insertion delay (step 246). The clock tree thus constructed must meet the max delay constraint. Second, the clock tree is analyzed to determine if the clock skew constraint has been violated. If so, the clock skew violations are corrected by inserting delays at buffer locations associated with the fastest arrival times (step 248). Finally, after correcting any clock skew violations, the clock tree is analyzed to determine if the arrival times at any endpoints violate the min delay constraint. If so, the min delay violations are corrected by inserting delays at buffer locations at or near the root node (step 250). In constructing the clock tree, the maximum transition time constraint is considered at all three steps of the clock tree insertion process. That is, at each step of the process, the edge rate of the clock signal at any endpoint must meet max the trans constraint before the clock tree is accepted. In this manner, a clock tree meeting timing constraints is constructed. The operation of the clock tree insertion process will now be described in detail.

Minimize Maximum Insertion Delay

At step 246, max delay solver module 202 in clock tree insertion system 200 operates to construct a buffer tree to distribute the clock signal to clock endpoints that minimizes maximum insertion delay while meeting the transition time constraint. In other words, the buffer tree is constructed so that the clock signal will arrive at the farthest endpoint in as small a delay as possible and in any case, the delay must be less than the max delay constraint. Meanwhile, the buffer tree is constructed to ensure that the clock signal transition time at any endpoint does not exceed the max trans constraint. The balancing of the max delay and max trans constraints may require a buffer to be added to boost the edge rate of the clock signal even if the buffer may introduce additional delay.

Figure 8:
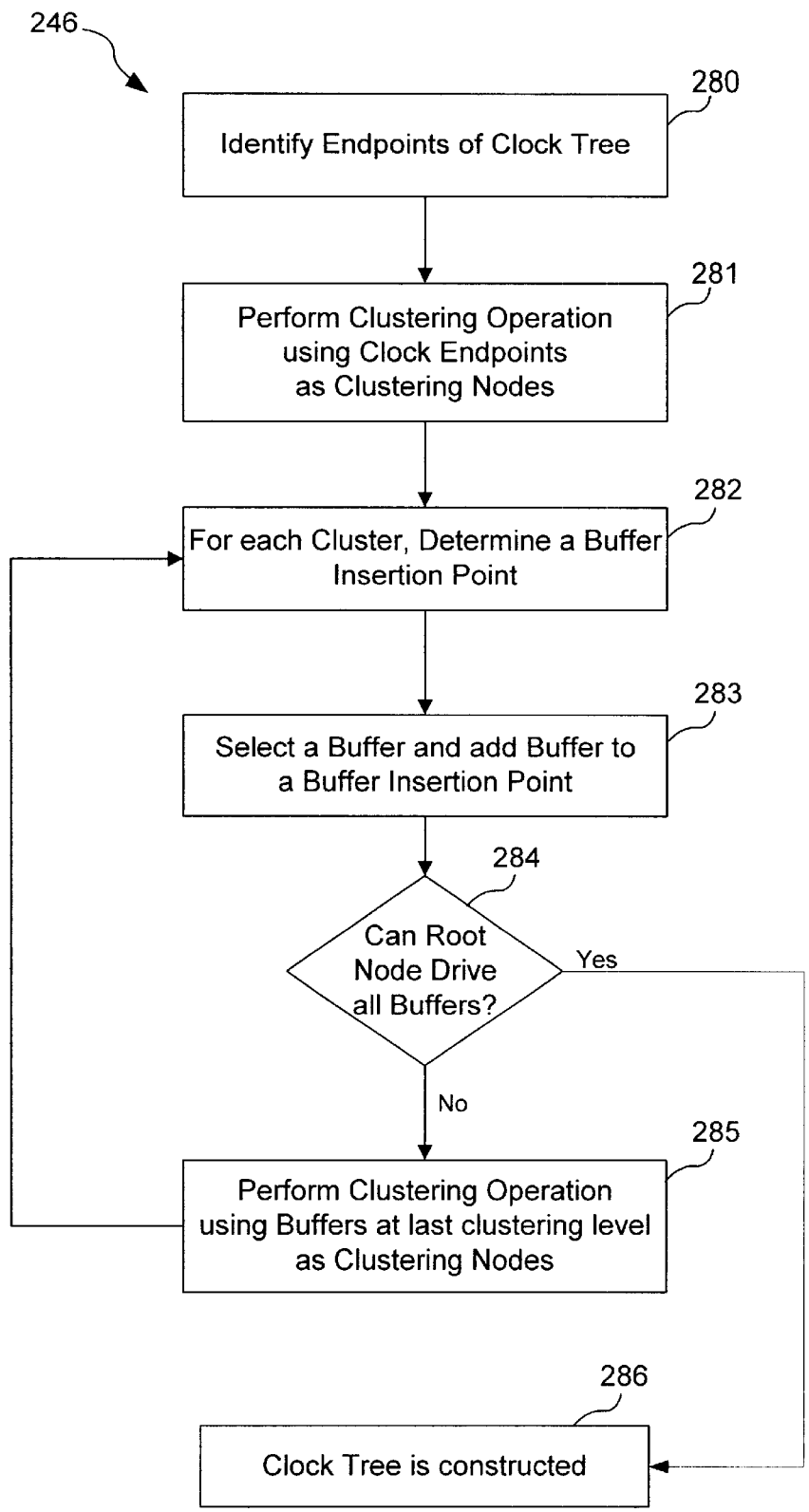
FIG. 8 is a flow chart illustrating the process for constructing a clock tree that minimizes the maximum insertion delay at any endpoints according to one embodiment of the present invention.

FIG. 8 is a flow chart illustrating the process for constructing a clock tree that minimizes the maximum insertion delay at any endpoints according to one embodiment of the present invention. Referring to FIG. 8, at step 280, the clock endpoints for the clock tree is identified. Clock endpoints are nodes in the integrated circuit design driven by the clock signal. Generally, there are three types of endpoints. Endpoints can include the clock input terminal of sequential logic gates (such as flip-flops and latches) where the clock signal stops at the logic gates. Endpoints can also include an input terminal of any combinational logic gates (such as NAND and NOR gates) where the clock signal propagates through the gate. Finally, endpoints may include input terminals at any Macro blocks such as memory blocks which can be driven by one or more clock signals.

After identifying the endpoints for the clock tree, a clustering operation is performed using the clock endpoints as clustering nodes (step 281). In the present description, "clustering nodes" refer to objects to be clustered in the clustering operation. As will become apparent in the description below, clustering nodes may be clock endpoints or may be buffers (i.e., input nodes of buffers in the clock tree). The clustering operation is illustrated in FIGS. 9a and 9b and the flowchart of FIG. 10.

Clustering Operation

Figure 9A:
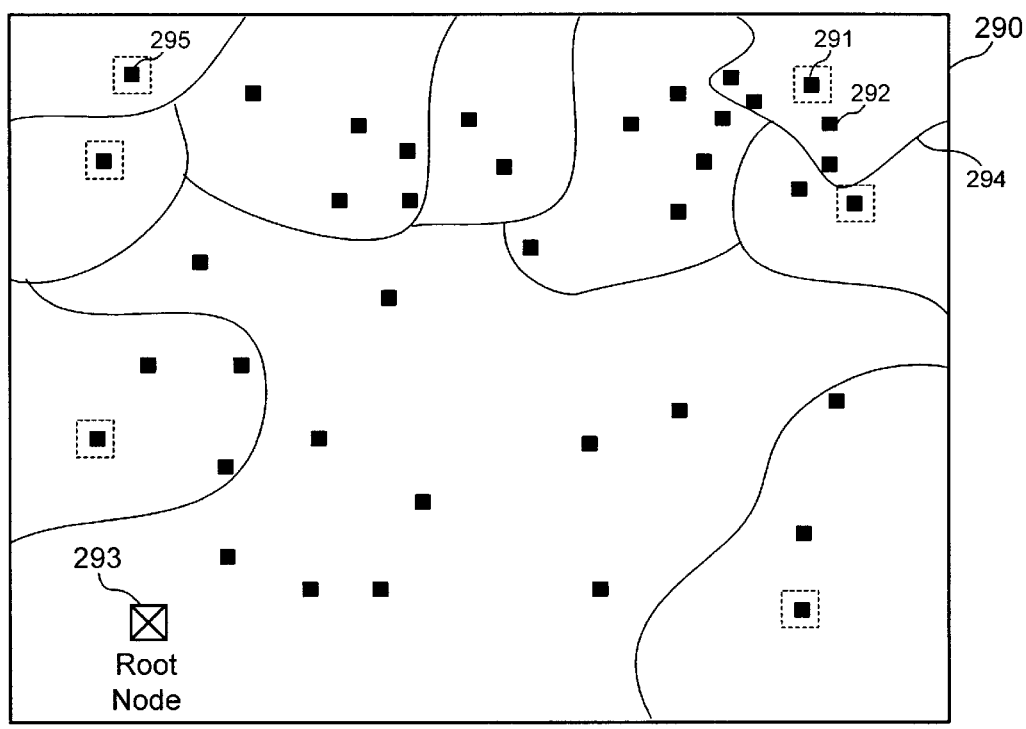
FIGS. 9a and 9b illustrate the operation of the clustering operation in grouping clock endpoints of an integrated circuit design into clusters.
Figure 9B:
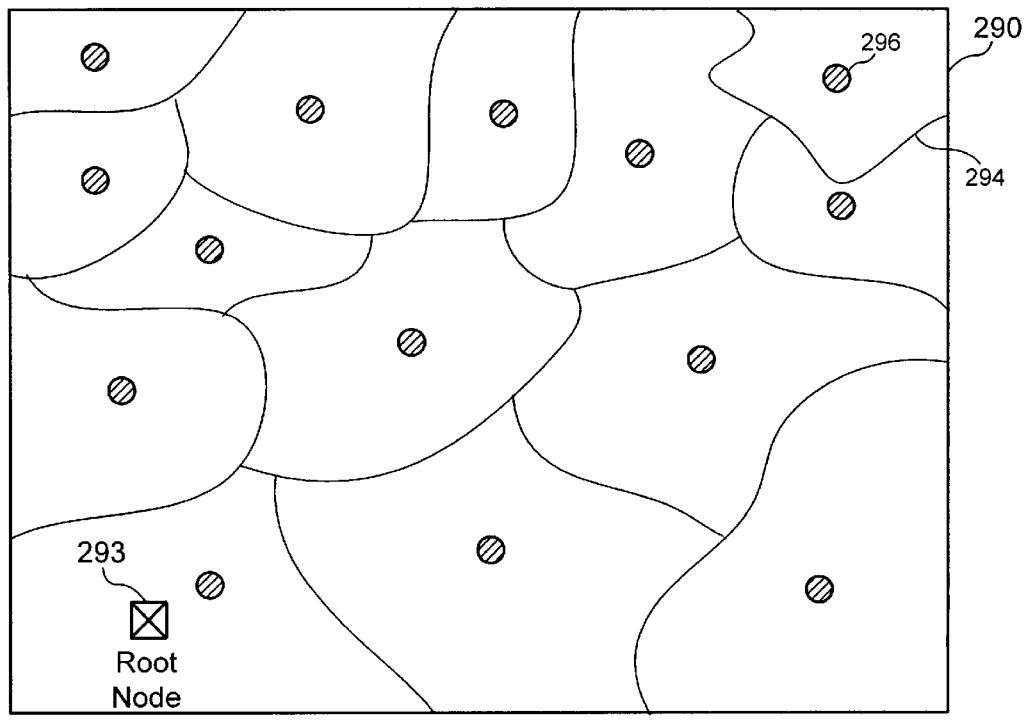

FIG. 9a is an abstract representation of an integrated circuit design 290 after the initial placement of the standard cell instances in the netlist of the design. A root node 293 has been specified for integrated circuit design 290. In FIG. 9a, the clock endpoints are shown as black dots scattered throughout integrated circuit design 290. In actual implementation, the standard cell instances are typically placed in rows defined by the physical constraints in specification 208 and therefore, the clock endpoints may not be randomly arranged as is shown in FIG. 9a. The placement of clock endpoints in FIG. 9a is illustrative only and is provided to show the spatial relationships between the clock endpoints and between the root node and the clock endpoints.

Figure 10:
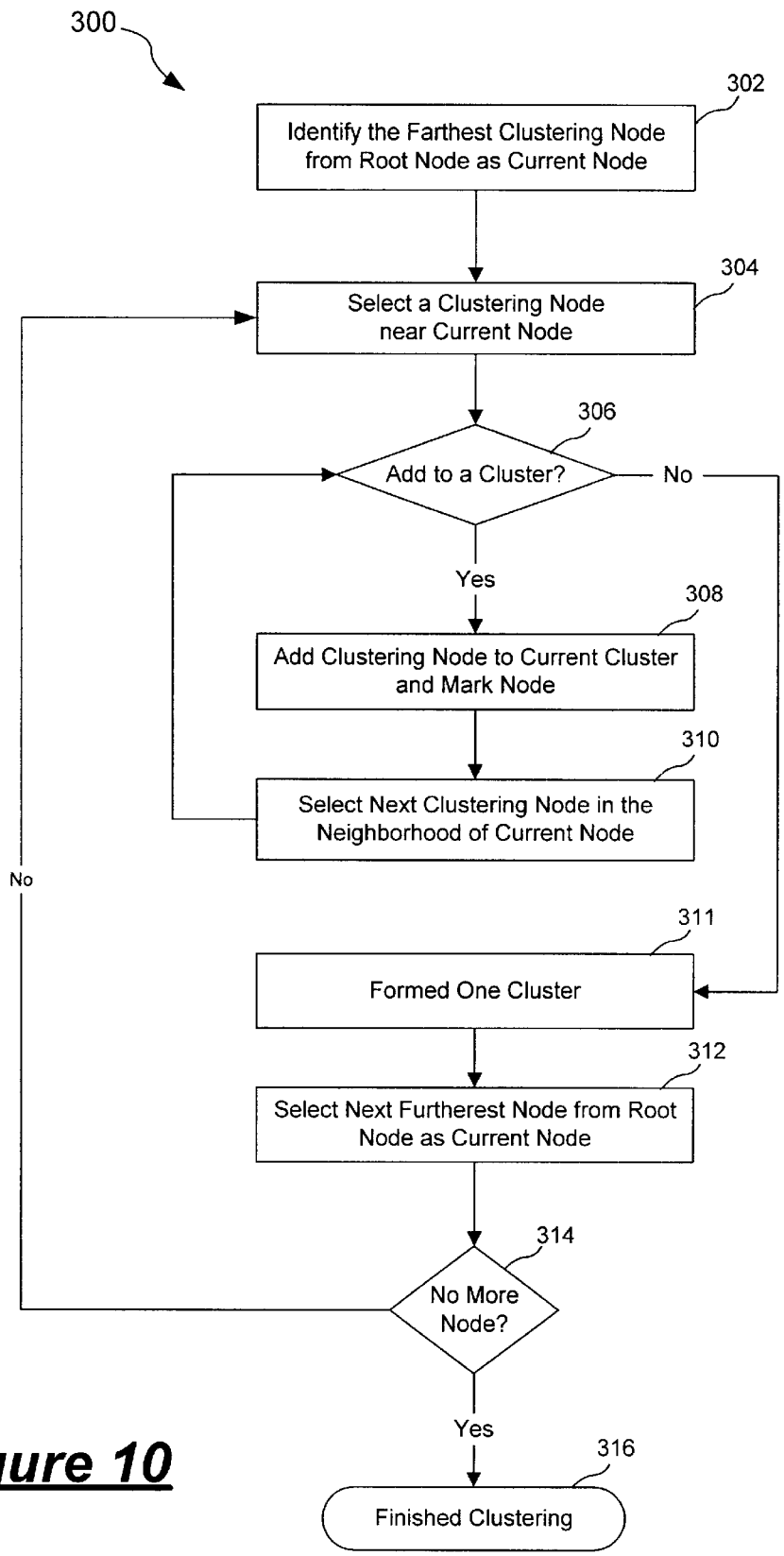
FIG. 10 is a flowchart illustrating the clustering operation according to one embodiment of the present invention.

Turning now to the clustering operation in step 281 where the clock endpoints are used as the clustering nodes. Referring to FIG. 10, clustering operation 300 starts by identifying the farthest clustering node from the root node and designating the farthest clustering node as the current node (step 302). The current node is used as the seed point for forming a cluster. If two or more clustering nodes have the same farthest distance from the root node, one of the nodes can be selected arbitrarily as the farthest clustering node. Alternately, clustering operation 300 may switch to another distance metric and determine which of the clustering node is farthest away from the root node.

In the present clustering operation, the farthest clustering node is the farthest endpoint from the root node. Referring to FIG. 9a, an endpoint 291 is identified as the farthest endpoint (farthest clustering node) from root node 293 and is thus selected as the current node. Then, at step 304, a clustering node near the current node is selected. For example, an endpoint 292 near endpoint 291 is selected.

Clustering operation 300 then determines at step 306 whether the selected node (endpoint 292) should be added to the cluster (the current cluster) defined by the current node (endpoint 291). The criteria are based on the timing and physical constraints for the design (specification 208) and for the clock tree (specification 210). In the present embodiment, the criteria include the buffer set that is available for building the buffer tree, as specified in the clock tree specification, and the maximum capacitate load that can be driven by the buffers. The selected node can be added to the current cluster if the addition does not cause max delay constraint and transition time constraint violations. Determination step 306 involves performing timing analysis on the integrated circuit design.

In the clock insertion process of the present invention, timing analysis is repeatedly performed in the various steps of the process. The timing analysis can be performed using any commercially available static timing analysis tool. At each step, a full timing analysis for the entire integrated circuit or an incremental timing analysis associated with nodes of interest can be performed as needed. One example of a static timing analysis tool is ShowTime available from Sequence Design, Inc. of Santa Clara, Calif.

To perform timing analysis, the integrated circuit design or the portion of the circuit of interest may need to be routed with wires so that wire delay can be estimated. The routing can be performed using any commercially available place and route tool, such as Silicon Ensemble from Cadence Design Systems, Inc. of San Jose. The place and route tool route wires between circuit elements of interest so that the actual capacitive load can be determined. In the present embodiment of the present invention, clock tree insertion system 200 uses a "route model" to estimate the actual wire routes and the effective capacitive loading between circuit elements. Instead of performing actual routing, the route model approximates the routing to determine the parasitic loading. The route model is, e.g., provided by PhysicalStudio from Sequence Design, Inc., of Santa Clara, Calif.

In accordance with the present embodiment of the present invention, the insertion delay of the clock signal is measured from the root node to the output node of the logic gate driven by the clock signal. For example, when an endpoint is the clock input of an instance of a flip-flop, the insertion delay of the clock signal is the delay measured from the root node to the Q (output) or NQ (inverted output) terminal of the flip-flop. In other embodiments, other schemes for measuring insertion delay of the clock signal can be used. Furthermore, in accordance with the present invention, the delay time is computed based on the effective capacitive loading, instead of the wire length of the wires connecting the root node to the output terminal of interest.

At step 306, when clustering operation 300 determines that all timing and physical constrains are met, the selected node can be added to the current cluster. At step 308, the selected node is added to the current cluster and is marked so that the clustering node is taken out of consideration in the next iteration of the clustering operation. The clustering operation continues by selecting the next node in the neighborhood of the current node (step 310). Steps 306 to 310 are repeated to determine if another node can be added to the current cluster. The process iterates until it is determined that a selected node cannot be added to the current cluster. For example, when adding the selected node will cause max trans violation because even the largest buffer in the buffer set cannot drive all of nodes in the cluster including the newly selected node, the clustering operation for the current cluster ceases and a cluster is formed (step 311). Referring to FIG. 9a, a cluster 294 is formed by the operation of steps 304 to 311.

After one cluster is formed, operation 300 proceeds by selecting the next farthest clustering node as the current node (step 312). For example, an endpoint 295 in design 290 may be selected. If the next farthest clustering node is not the last node (step 314), steps 304 to 311 are repeated until another cluster is formed based on the current node. If there are no more nodes to be clustered (step 314), the clustering operation based on the clock endpoints is completed (step 316). FIG. 9a illustrates the progress of clustering operation 300 where several clusters have been formed around the perimeter of integrated circuit design 290. FIG. 9b illustrates the completion of the clustering operation where all endpoints in integrated circuit design 290 have been grouped into a respective cluster.

FIG. 10 illustrates one embodiment of the clustering operation of the present invention. Other methods for clustering objects may be used in the clock tree insertion method of the present invention. In one embodiment, instead of selecting one neighboring clustering node at a time and determining if the selected node can be added to a current cluster, the clustering operation can select a group of clustering nodes near the farthest clustering node (the current node). The group of clustering node is sorted by distance to the current node. Then, the clustering node nearest to the current node is tested to determine if the node should be added to the cluster using the criteria discussed above. The process continues until the clustering nodes in the group is exhausted or a cluster is formed. When all clustering nodes are exhausted or when a new cluster is to be formed, the process proceeds by selecting another group of clustering nodes near the farthest clustering node.

Returning to FIG. 8, after the clustering operation based on the clock endpoints (step 281), the clock tree insertion process proceeds to determine a buffer insertion point for each cluster (step 282). In one embodiment, the geometric center of the area occupied by the cluster is used as the buffer insertion point. The geometric center is the arithmetic mean of the distances from the buffer insertion point to the endpoints within a cluster. In accordance with another aspect of the present invention, the buffer insertion point is positioned at a "zero-skew" point within the cluster. The determination of the zero-skew point within a cluster will be described in more detail below. FIG. 9b illustrates buffer insertion points for each of the clusters formed by clustering operation (step 281). For example, a buffer insertion point 296 is selected for cluster 294.

Next, at step 283, a buffer for each cluster is selected from the buffer list and the selected buffer is added to the buffer insertion point identified in the previous step. Traditional methods for buffer selection can be used. For example, in one traditional method, the buffer can be selected to give a fanout factor of e. In other embodiments, the selection process is carried out by computing a cost function associated with each buffer in the buffer list, and selecting the buffer with the best cost characteristics. The cost function can be based on a variety of factors, such as the estimated insertion delay time and the clock signal transition time provided by the buffer.

In accordance with another aspect of the present invention, a method for optimal driver selection is used for selecting the buffer from a list of candidate buffers. The optimal driver selection method uses a cost function based on the delay characteristic and the capacitive gain of each buffer is the buffer list. The capacitive gain is defined as $C_{OUT}/C_{IN}$ where $C_{OUT}$ is the output capacitance and $C_{IN}$ is the input capacitance of the buffer. The cost function operates to balance the benefits from a shorter delay with benefits from a faster edge rate. For instances, in some situations, it may be more desirable to select a buffer with slightly more delay but a much larger capacitive gain (i.e., capable of boosting the edge rate) over a buffer with less delay but a relatively small capacitive gain (slow edge rate). Thus, a buffer with the best cost characteristics should be one providing the shortest delay time and the fastest edge rate. The optimal driver selection method of the present invention will be described in more detail below.

After buffers are selected for each cluster (step 283), the clock tree insertion process determines if the root node can drive all of the buffers in the current level of buffers (step 284). The determination is made based on whether the root node can drive all of the buffers at the current level within the required max delay and max trans constraints. For typical integrated circuit designs, the root node is generally not able to drive all of the buffers formed by clustering the clock endpoints. Therefore, the clock tree insert process continues by adding one or more level of buffers to the buffer tree.

Thus, at step 285, the clustering operation is performed using the buffers at the previous buffer level as the clustering nodes. The clustering operation operates in the same manner as described in FIG. 10 while using the buffer insertion points as the clustering nodes. As a result of the clustering operation in step 285, a second level of buffers is formed consisting of buffers driving a number of buffers within a cluster. In fact, the clustering operation (step 285) and the buffer selection and insertion process (steps 282 and 283) are repeated recursively to group the buffers at each level for forming a multi-level buffer tree. After the addition of each level of buffers, determination step 284 checks to see if the root node can drive all of the buffers at that level within the required max delay and max trans constraints. If not, another level of buffers is added to speed up the clock and to sharpen the clock edges until the criteria are met. The clustering operation of the buffers is completed when the root node is able to drive all of the buffers in a given level within the specified timing constraints. A clock tree is thus constructed (step 286).

Figure 11:
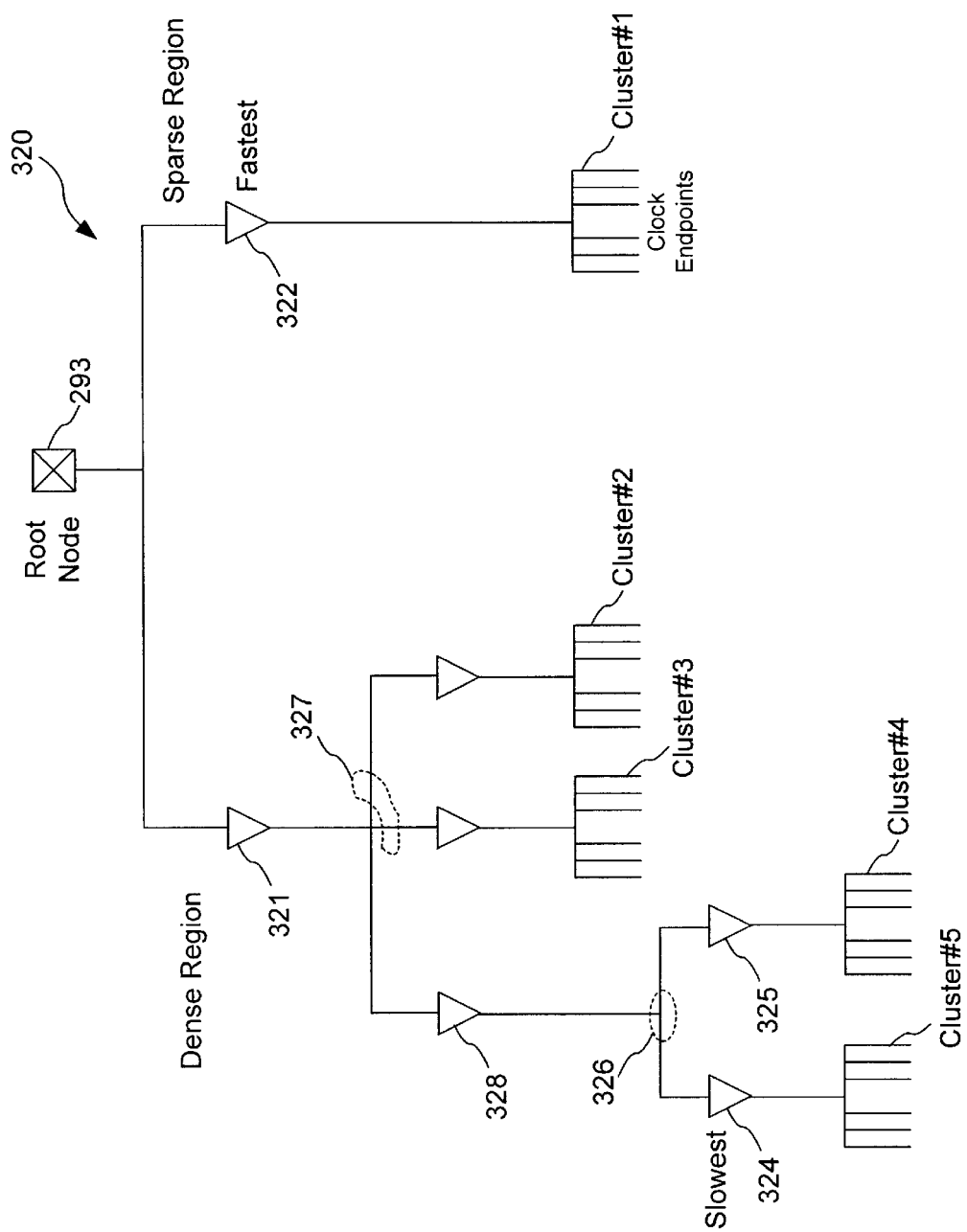
FIG. 11 illustrates a clock tree constructed to minimize the maximum insertion delay using the clock tree insertion process of the present invention.

FIG. 11 illustrates a clock tree constructed to minimize the maximum insertion delay using the clock tree insertion process of the present invention. A clock tree 320 connects root node 293 to the clock endpoints through a series of buffers at several buffer levels. Through the use of the clustering operation, clock tree 230 balances between endpoints in spare regions and endpoints in dense regions by including more clusters and more levels of buffers in the dense region. In FIG. 11, clock tree 320 includes three levels of buffers driving five clusters of clock endpoints. A buffer 322 driving cluster no. 1 represents the fastest path of the clock signal from root node 293 to the endpoints in cluster no. 1. A buffer 324 driving cluster no. 5 represents the slowest path of the clock signal from root node 293 to the endpoints in cluster no. 5. Through the use of the cost function in the buffer selection process, the clock tree insertion process minimizes the insertion delay even in the slowest path so that clock tree 320 not only meets the max delay constraint but minimizes the maximum insertion delay to any endpoints as much as possible. Of course, the clock tree always meets the transition time constraint (max trans) at all endpoints.

Analyze and Correct Clock Skew Violations

Returning to FIG. 5, after a clock tree (such as clock tree 320) is constructed in step 246, the clock tree insertion process continues by analyzing the clock skew of the clock tree and correcting any clock skew violations (step 248).

Figure 12:
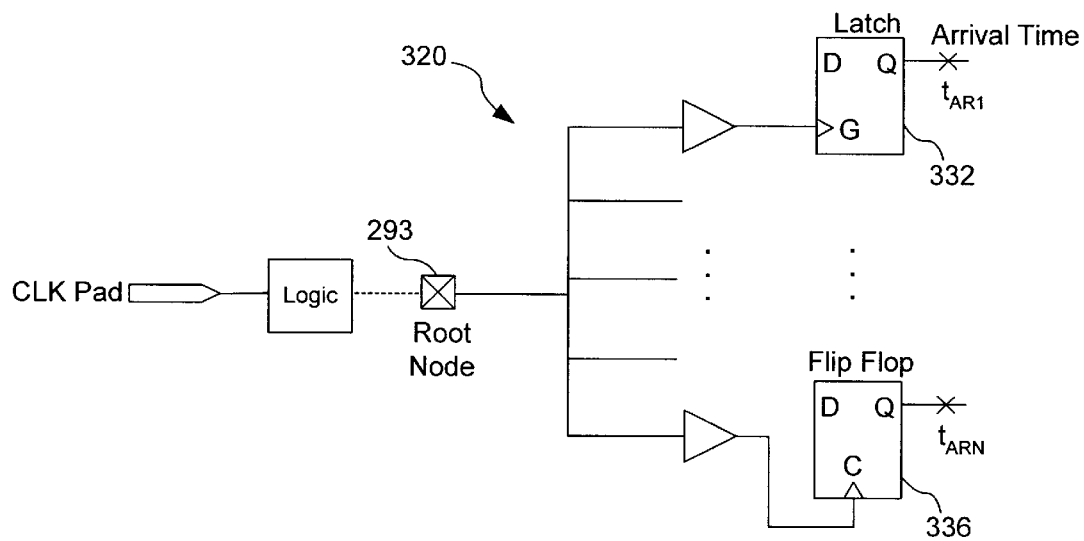
FIG. 12 is another representation of the clock tree in FIG. 11 illustrating the connection of the clock tree to sequential logic gates as clock endpoint.
Figure 13:
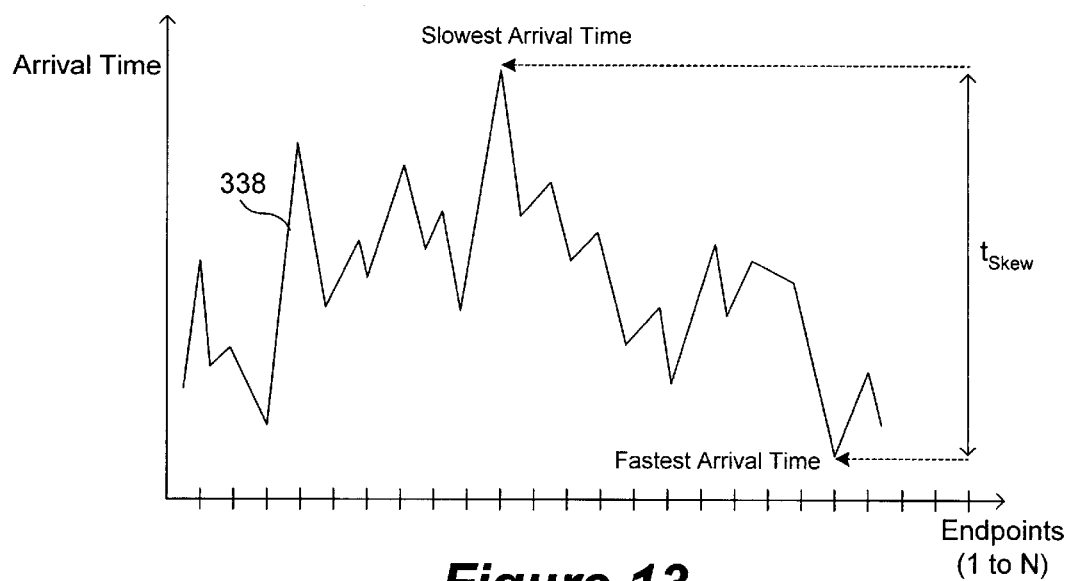
FIG. 13 is a plot of the arrival times for the clock endpoints of the clock tree in FIG. 11.

As described above, clock skew measures the difference between the fastest arrival time and slowest arrival time of the clock signal in the clock tree. Clock tree specification 210 includes a max skew constraint defining the maximum value for the clock skew, that is, the maximum difference between the fastest arrival time and the slowest arrival time in the clock tree. FIG. 12 is another representation of the clock tree in FIG. 11 illustrating the connection of the clock tree to sequential logic gates as clock endpoints. Clock tree 320 is illustrated in simplified form in FIG. 12 and does not include all the levels of buffers that would be present in the clock tree. In FIG. 12, clock tree 320 drives the gate terminal of a latch 332. An arrival time $t_{AR1}$ associated with latch 332 can be measured at the Q output terminal of the latch. Clock tree 320 also drives the clock terminal of a flip-flop 336 with associated arrival time $t_{ARN}$ measured at the Q output terminal of the flip-flop. By measuring the arrival times at all of the endpoints, a plot of the arrival times for the endpoints can be obtained, as shown in FIG. 13. Referring to FIG. 13, curve 338 denotes the arrival times of the clock signal in clock tree 320 across N clock endpoints. The difference between the fastest arrival time and the slowest arrival time is the clock skew ($t_{Skew}$). Note that in the clock construction step (step 246), clock tree 320 is constructed so that the slowest arrival time is as small as possible. Therefore, if the clock skew of clock tree 320 violates the max skew constraints, skew solver module 203 is engaged to correct the clock skew violation. Clock skew correction is applied by slowing down the fastest arrival times so as to compress curve 338 and reduce the clock skew. The clock arrival times are slowed down by adding delays at buffers associated with the fastest arrival times.

Figure 14:
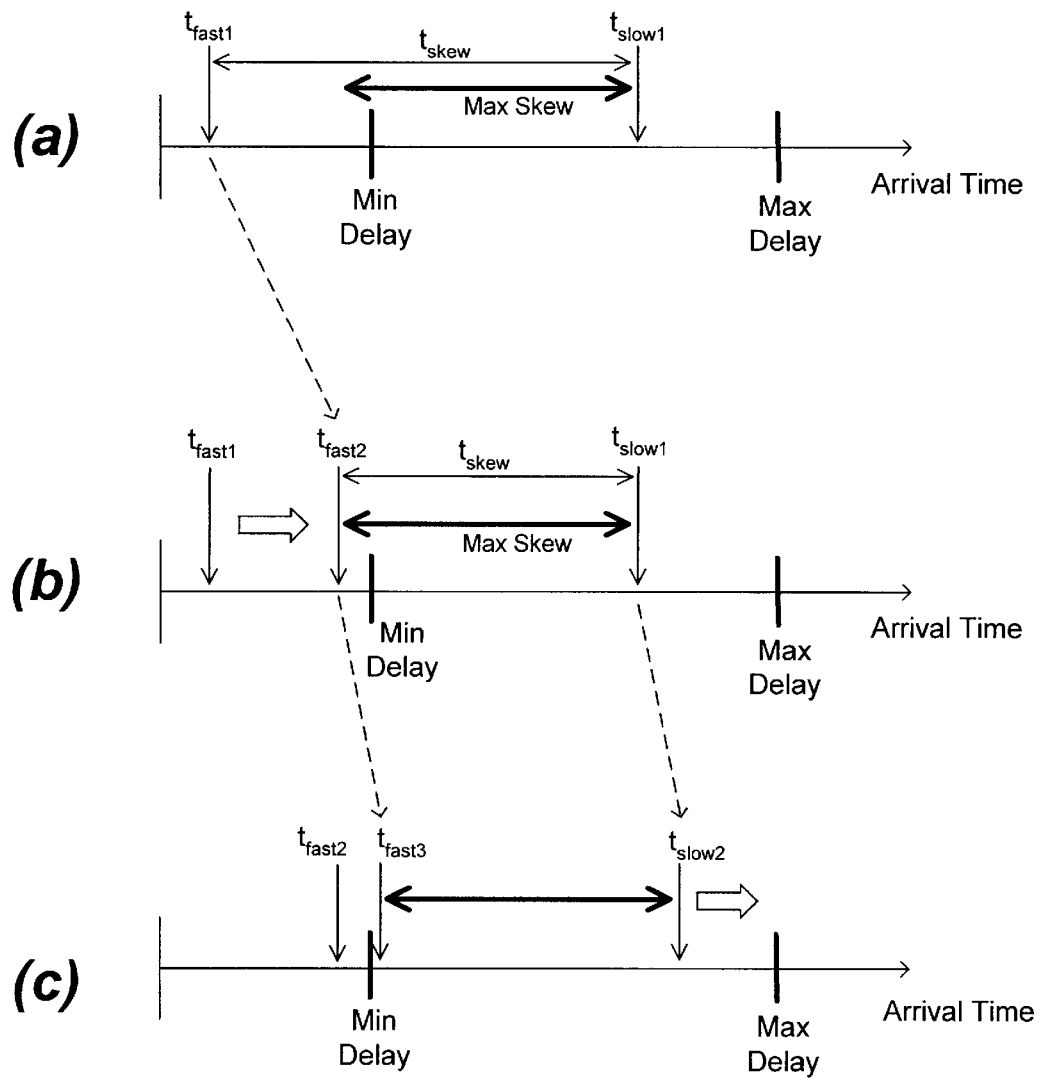
FIG. 14 includes three timing diagrams illustrating the arrival times at the clock endpoints of clock tree 320 at various steps of the clock tree insertion process.

FIG. 14 includes three timing diagrams illustrating the arrival times at the clock endpoints of clock tree 320 at various steps of the clock tree insertion process. Timing diagram (a) in FIG. 14 illustrates the arrival times of clock tree 320 after the clock tree construction step 246. The timing constraints min delay, max delay and max skew are shown in FIG. 14 to illustrate the timing constraints the clock tree must meet. Referring to timing diagram (a), in the present illustration, clock tree 320 has a maximum insertion delay of $t_{slow1}$ (the slowest arrival time) and a minimum insertion delay of $t_{fast1}$ (the fastest arrival time). While the maximum insertion delay $t_{slow1}$ is less than the max delay constraint, the clock skew $t_{Skew}$ of clock tree 320 exceeds the max skew constraint. Therefore, clock skew correction is required.

Figure 15:
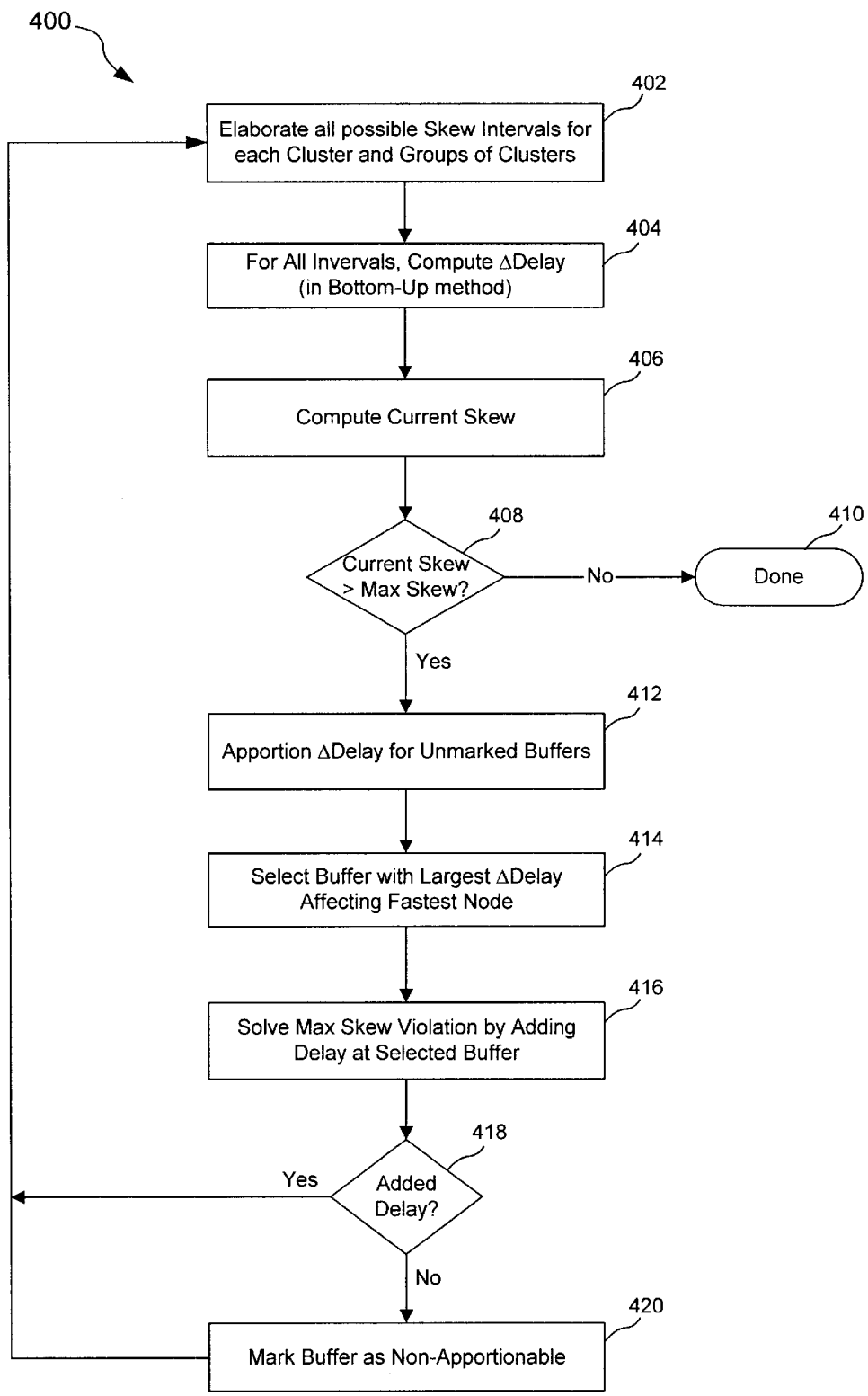
FIG. 15 is a flow chart illustrating the clock skew correction process according to one embodiment of the present invention.

FIG. 15 is a flow chart illustrating the clock skew correction process according to one embodiment of the present invention. Skew solver module 203 operates the clock skew correction process to detect and correct clock skew violations. Referring to FIG. 15, clock skew correction process 400 begins by elaborating all possible skew intervals for each cluster and each group of clusters in clock tree 320 (step 402). The concept of "skew intervals" will be explained with reference to FIGS. 11 and 16.

Figure 16:
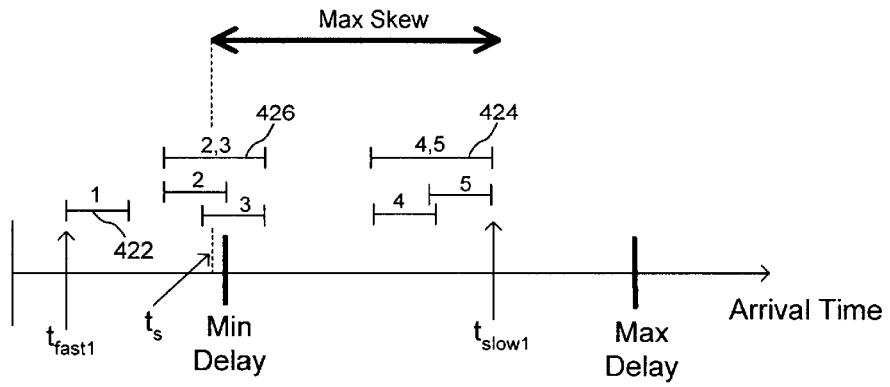
FIG. 16 is a plot of the arrival times for various skew intervals for the clock tree in FIG. 11.

Referring to FIG. 11, each cluster of clock endpoints driven by a buffer will have an associated spread of clock signal arrival times from root node 293. A "skew interval" is the spread of clock signal arrival times for a cluster of endpoints or for a group of clusters. The spread of arrival times (skew intervals) for clusters nos. 1 to 5 of clock tree 320 is depicted in the timing diagram in FIG. 16. Referring to FIG. 16, a bar 422 represents the skew interval for cluster no. 1. Since cluster no. 1 is in the fastest path of the clock signal, the fastest arrival time in cluster no. 1 is the arrival time $t_{fast1}$ of clock tree 320. The skew intervals for cluster nos. 2 to 5 are also shown in FIG. 16. A skew interval can also be formed by grouping two or more clusters. In accordance with the present invention, two clusters can be grouped if their associated buffers share a common node such as any delay introduced at the common node will affect the arrival times at the endpoints of both clusters. For example, referring to FIG. 11, cluster no. 4 is driven by a buffer 325 and cluster no. 5 is driven by buffer 324. Both buffers 324 and 325 share a common node 326. Any delay introduced at node 326 will affect the arrival times at the endpoints of cluster nos. 4 and 5. Therefore, a skew interval can be expressed for cluster nos. 4 and 5. Referring to FIG. 16, a bar 424 represents the skew interval for cluster nos. 4 and 5. Another possible grouping of clusters is cluster nos. 2 and 3. The buffers driving cluster nos. 2 and 3 share a common node denoted by a dotted circle 327. The skew interval for cluster nos. 2 and 3 is shown as a bar 426 in FIG. 16. Other possible skew intervals for clock tree 320 include a skew interval for cluster nos. 2, 4 and 5, a skew interval for cluster nos. 3, 4 and 5, a skew interval for cluster nos. 2, 3, 4 and 5, and a skew interval for cluster nos. 1, 2, 3, 4 and 5 where the common node is root node 293.

At step 402 of clock skew correction process 400 (FIG. 15), process 400 elaborates all possible skew intervals for clock tree 320. Process 400 also identifies a buffer insertion point for each skew interval. For a skew interval of one cluster, the buffer insertion point is the input node to the buffer driving the cluster. For a skew interval of two or more clusters, the buffer insertion point is the common node of the clusters or the input node of the buffer driving the common node. For example, for the skew interval for cluster nos. 4 and 5, the buffer insertion point is node 326 or input node to buffer 328.

Then, process 400 computes a "ΔDelay" value for each skew interval (step 404). The computation is performed in a bottom-up method. That is, ΔDelay values are computed at the lowest level of the clock tree (the clock endpoints) first and then the computation moves up towards the top level (the root node) of the clock tree. The use of the bottom-up method improves computational efficiency.

In accordance with the present invention, "ΔDelay" is defined as the maximum insertable delay which can be added to a skew interval without causing a max delay violation. Referring to FIG. 16, ΔDelay value is the maximum delay amount which each skew interval can be pushed back (or slowed down) without exceeding the max delay constraint. The ΔDelay value for a skew interval i can be computed as follows:

$$\Delta Delay_i = \text{Max Delay} - (\text{Min}_i + \text{Skew}_i),$$

where Max Delay is the max delay timing constraint, $\text{Min}_i$ is the fastest arrival time in the skew interval i, and $\text{Skew}_i$ is the skew (or spread of arrival times) of the skew interval i. $\text{Skew}_i$ is therefore the difference between the fastest arrival time and the slowest arrival time within a skew interval i. Using the equation for ΔDelay given above, the ΔDelay values for all the skew intervals which have been elaborated can be computed.

Next, process 400 compute the current skew of the clock tree (step 406). The current skew for clock tree 320 is $t_{Skew}$ which is the difference between the fastest arrival time ($t_{fast1}$) and the slowest arrival time ($t_{slow1}$). Then, at step 408, process 400 determines if the current skew exceeds the max skew constraint imposed by the clock tree specification. If the current skew is within the max skew constraint, the clock skew correction process terminates (step 410). Referring to timing diagram (a) in FIG. 14, the current skew $t_{Skew}$ for clock tree 320 exceeds the max skew constraint, therefore process 400 proceeds to correct the clock skew violation.

At step 412, process 400 apportions ΔDelay values for unmarked buffers in the clock tree. At the commencement of process 400, all buffers in clock tree 320 are unmarked. The criteria for marking a buffer in process 400 will be explained in more detail below. In the clock skew correction process, ΔDelay values are apportioned so that delays can be introduced optimally in the clock tree for correcting the clock skew violation. The process for apportioning ΔDelay will be explained with reference to FIG. 17.

Figure 17:
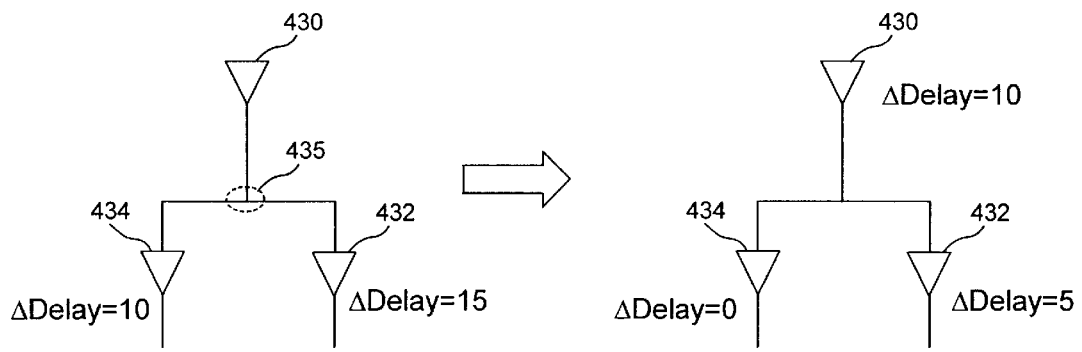
FIG. 17 illustrates the process for apportioning ΔDelay values according to one embodiment of the present invention.

Apportioning ΔDelay is the process of determining a common ΔDelay value that is shared among two or more clusters that share a common node and assigning the common ΔDelay value to a buffer at the parent buffer of the clusters. Referring to FIG. 17, a portion of clock tree 320 is shown including buffers 432 and 434 which may be each driving a cluster of clock endpoints or each driving buffers at a lower level of the clock tree. At buffer 432, a ΔDelay value of 15 is computed. At buffer 434, a ΔDelay value of 10 is computed. (For the purpose of the present description, the unit of the delay value is arbitrary and is therefore not listed. In typical applications, the delay value can be represented in units of capacitance, such as pico-farad, or in units of time, such as nano-second.) If clock skew correction is applied at buffers 432 and 434, a total delay value of 25 needs to be introduced to correct the clock skew violation.

However, because buffers 432 and 434 share a common node 435 driven by a buffer 430, their ΔDelay values can be apportioned. The common ΔDelay value of buffers 432 and 434 is 10. The clock skew correction process of the present invention will apportion the common ΔDelay value of buffers 432 and 434 and assign the common ΔDelay value to buffer 430 driving common node 435. As shown in FIG. 17, after the apportionment, a ΔDelay value of 10 is assigned to buffer 430. As a result of the apportionment, the ΔDelay value at buffer 434 is now zero and the ΔDelay value at buffer 432 is now 5. To correct clock skew violations after the apportionment, a total delay of only 15, as compared to a delay value of 25 previously, is needed to be added to the clock tree. By reducing the amount of delay to be introduced for clock skew correction, a smaller buffer can be used and less silicon area is consumed. In summary, apportioning ΔDelay in clock tree 320 has the advantage of ensuring that only the minimum amount of delay is added to the clock tree for correcting clock skew violations.

In accordance with the present invention, the process for apportioning ΔDelay follows two basic rules. First, in apportioning the common ΔDelay values, the drive strength of the buffer set is considered to avoid obtaining infeasible ΔDelay values. Infeasible ΔDelay values are delay values which are not supported by any buffer or any combination of buffers in the buffer set. For example, referring again to FIG. 17, if buffer 432 has a ΔDelay value of 10.5 and buffer 434 has a ΔDelay value of 10, then their common ΔDelay value of 10 is not apportioned to buffer 430 if there is no buffer in the buffer set which can give a delay of 0.5, the remaining delay value, to buffer 432.

Second, before apportioning the ΔDelay values, the ΔDelay values are limited to the amount of skew correction needed to meet the max skew constraint. The amount of skew correction, ΔSkew, is the difference between the current skew of the clock tree and the target skew (max skew). That is, ΔSkew is given by:

$$\Delta Skew = t_{skew} - Max\ Skew,$$

where $t_{skew}$ is the current skew of the clock tree and Max Skew is the max skew constraint imposed by the clock tree specification. Any computed ΔDelay values should be less than or equal to ΔSkew because ΔSkew is the maximum skew correction that is needed for the clock tree to meet timing constraints. In the present embodiment, any ΔDelay value that is greater than ΔSkew is set to equal to ΔSkew.

Returning to FIG. 15, having now computed and apportioned the ΔDelay values for all buffers in the clock tree (step 412), clock skew correction process 400 can then proceed to solve the clock skew violations in the clock tree.

At step 414, process 400 proceeds to select the buffer with the largest ΔDelay value affecting the fastest node in the clock tree. For example, referring to FIG. 16, cluster no. 1, driven by buffer 322, is the fastest node in clock tree 320. If the ΔDelay value for cluster no. 1 (bar 422) is the largest ΔDelay value, then buffer 322 is selected.

Next, at step 416, process 400 operates to solve the clock skew violation at the selected buffer by adding the desired amount of delay at the selected buffer. The desired amount of delay is the ΔDelay value of the selected buffer. In the present embodiment, three methods of adding delay are used. The delay can be added by adding a buffer from the buffer set having the required amount of delay. The buffer can be positioned before or after the selected buffer and can be positioned at any distance from the selected buffer. The delay can also be added by resizing the selected buffer. Resizing means replacing the selected buffer with another buffer in the buffer set that is larger or smaller in size than the selected buffer. For example, if the selected buffer is replaced with a smaller buffer, the edge rate of the clock signal will be reduced and thus the delay is increased. Lastly, the delay can be added by repositioning the selected buffer. Repositioning the selected buffer adds delay through adding wire delay from the additional wiring. Referring to FIG. 16, by adding delay to buffer 322 driving cluster no. 1, bar 422 will be shifted to the right so that even the fastest arrival time for cluster no. 1 will be within the max skew timing constraint.

At step 418, process 400 determines if step 416 is successful in adding delay at the selected buffer. Process 400 may not be able to add the desired amount of delay (ΔDelay) to the selected buffer. One reason why delay cannot be added is that process 400 cannot find an appropriate buffer to introduce the desired delay. Another reason why delay cannot be added is that process 400 cannot find a location to place the new buffer. The placement of the existing integrated circuit design may be too dense for process 400 to find a reasonable location to place the buffer or the placement of the buffer may be prevented by the presence of obstructions, such as a large memory block, near the intended buffer insertion point. If the desired amount of delay cannot be added, then process 400 marks the buffer as non-apportionable (step 420). Marking a buffer as non-apportionable will prevent any apportionment (step 412) to take pace at that buffer in the next iteration of process 400. By preventing apportionment, process 400 will not try to apportion the ΔDelay values in the next iteration so that the clock skew violation can be solved at each constituent buffer. Referring to FIG. 17, if step 416 fails to find a buffer to add the common ΔDelay value of 10 to buffer 430, then at the next iteration, process 400 will not apportion the ΔDelay values and instead will try to add the ΔDelay values, 15 and 10, at each of buffer 432 and 434.

Returning to FIG. 15, if process 400 is successful in adding delay (step 418), or if process 400 cannot add delay and the selected buffer is marked as non-apportionable (step 420), clock skew correction process 400 iterates by repeating steps 402 to 420 until the clock skew of the clock tree no longer violates the max skew constraint.

The iteration of clock skew correction process 400 can be explained with reference to FIG. 16. For example, in the first iteration, process 400 adds delay to cluster no. 1 so that bar 422 is moved to within the max skew constraint. That is, bar 422 is moved so that the fastest arrival time (the left edge of bar 422) is greater than or equal to a time $t_s$ where $t_s=t_{slow1}-$ max skew. Having solved the clock skew violation at cluster no. 1, cluster no. 2 becomes the next clock skew violation to be solved. However, if cluster no. 2 is corrected individually, apart from cluster no. 3, the correction of cluster no. 2 and subsequently cluster no. 3 may result in a large delay being added to the clock tree. Instead, in the second iteration, process 400 has apportioned the ΔDelay value at cluster nos. 2 and 3 so that process 400 first corrects the skew interval for the two clusters together (bar 426). After adding ΔDelay value at the common buffer of cluster nos. 2 and 3, cluster no. 2 may have remaining ΔDelay which needs to be corrected. In the third iteration, process 400 can then add the remaining ΔDelay to cluster no. 2. In this manner, clock skew violations in the clock tree are corrected.

Timing diagram (b) in FIG. 14 illustrates the result of the clock skew correction process on clock tree 320. After the operation of the clock skew correction process, the previously fastest arrival time of clock tree 320, $t_{fast1}$, has been slowed down to a new fastest arrival time $t_{fast2}$. The clock skew $t_{skew}$ of clock tree 320, $t_{slow1}-t_{fast2}$, is now within the max skew constraint.

In the clock skew correction process, the only correction made is the addition of delays to buffers with the fastest arrival times to slow down the clock tree and compress the clock skew. This clock skew correction methodology is possible because the clock tree, as constructed, is made as fast as possible. The slowest arrival time, $t_{slow1}$, is within the max delay constraint and is "fixed." Therefore, the slowest arrival time $t_{slow1}$ cannot be speed up any further to compress the clock skew. The clock skew correction process can focus only on adding delays to the fastest arrival times for correcting the clock skew.

Analyze and Correct Min Delay Violation

Returning to FIG. 5, up to step 248, the clock tree insertion process has constructed a clock tree meeting max delay, max skew, as well as max trans constraints. The clock tree insertion process continues by analyzing the clock tree and correcting any min delay violations (step 250).

Referring to timing diagram (b) of FIG. 14, after the clock skew correction, clock tree 320 now has a slowest arrival time $t_{slow1}$ which is less than the max delay constraint and a clock skew $t_{skew}$ which is equal to or less than the max skew constraint. However, the fastest arrival time $t_{fast2}$ of clock tree 320 is less than min delay, thus violating the min delay constraint.

In general, a clock tree specification specifies a max skew that is less than the difference between the max delay and the min delay. Therefore, by first meeting the max delay and max skew constraints, any min delay violation can be corrected by adding delay to the root node of the clock tree so that the delay for the entire clock tree is increased. Referring to timing diagram (c) of FIG. 14, delaying the entire clock tree has the effect of sliding the arrival times of clock tree 320 to the right until all of the arrival times for the clock tree are greater than the min delay constraint. The amount of delay to add for correcting min delay violations is the difference between the min delay constraint and the fastest arrival times of the clock tree. In the present example, the amount of delay to be added is (min delay$-t_{fast2}$).

Alternately, min delay violations can also be corrected by adding delay to primary nodes of the clock tree. The primary nodes of the clock tree are nodes of the buffer tree just below the root node. When delay is added to the primary nodes, the delay time for part of the clock tree is increased with the net result that the clock skew of the clock tree is reduced. The min delay violations can thus be solved.

Min delay solver module 204 of clock tree insertion system 200 operates to correct the min delay violations. The operation of the min delay correction process is analogous to the max skew correction process except that delay is added at the root node or the primary buffers of the clock tree. In the present description, the primary buffers of clock tree 320 refer to the buffers driving the primary nodes of the clock tree, that is, buffers at levels just below the root node. For example, referring to FIG. 11, the primary buffers can include buffers 321 and 322 which are at a buffer level just below root node. Delays added to both buffers 321 and 322 will affect the entire clock tree. Alternately, delays added to just buffer 321 but not buffer 322 will only affect delay times of clock tree nodes driven by buffer 321.

Figure 18:
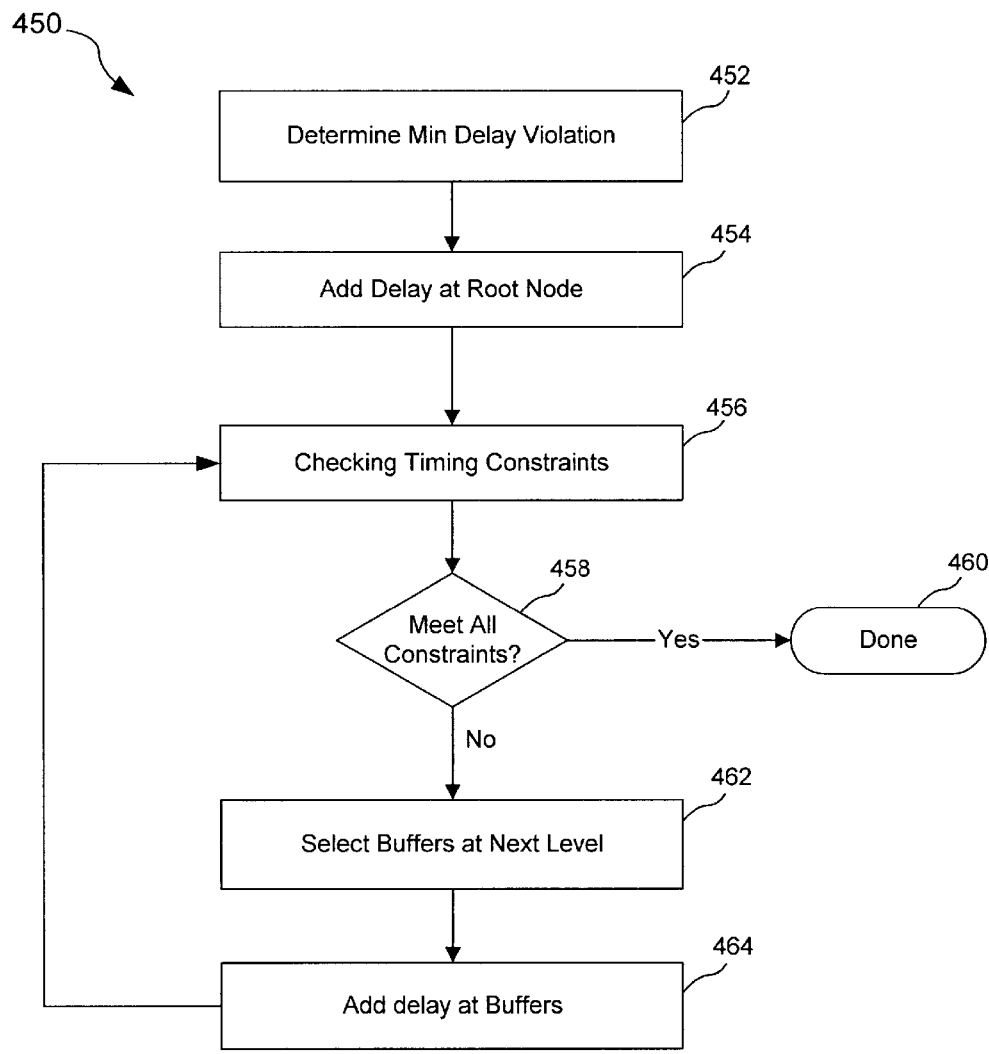
FIG. 18 is a flow chart illustrating the min delay correction process according to one embodiment of the present invention.

FIG. 18 is a flow chart illustrating the min delay correction process according to one embodiment of the present invention. Referring to FIG. 18, min delay correction process 450 starts by determining the amount of min delay violation to be corrected in the clock tree (step 452). As described above, in the present example, the amount of min delay violation is (min delay$-t_{fast2}$) (timing diagram (c) in FIG. 14). Then, process 450 proceeds to add the requisite amount of delay at the root node of the clock tree (step 454). Next, process 450 checks to see if the clock tree meets all of the timing constraints specified in the clock tree specification (step 456).

If all of the timing constraints are met (step 458), the min delay violation has been corrected without introducing other violations and process 450 terminates (step 460). If adding delay at the root node cannot solve the min delay violation or other timing violations (such as max trans) are introduced (step 458), then process 450 proceeds to select buffers at the next level of the clock tree (step 462). Process 450 adds delay at the next level of buffers to attempt to solve the min delay violations (step 464). Process 450 repeats at step 456 for checking whether the clock tree meets all of the timing constraints. Process 450 iterates steps 456 and 464 until the min delay violations are corrected without introducing other timing violations.

Returning to timing diagram (c) of FIG. 14, after the operation of the min delay correction process (step 250 of FIG. 5), the arrival times for clock tree 320 are shifted so that all of the arrival times are greater than min delay. Specifically, clock tree 320 now has a fastest arrival time of $t_{fast3}$ which is greater than min delay, a slowest arrival time of $t_{slow2}$ which is less than max delay, and a clock skew $t_{skew}$ of ($t_{slow2}-t_{fast3}$) that is equal to or less than max skew.

Figure 1:
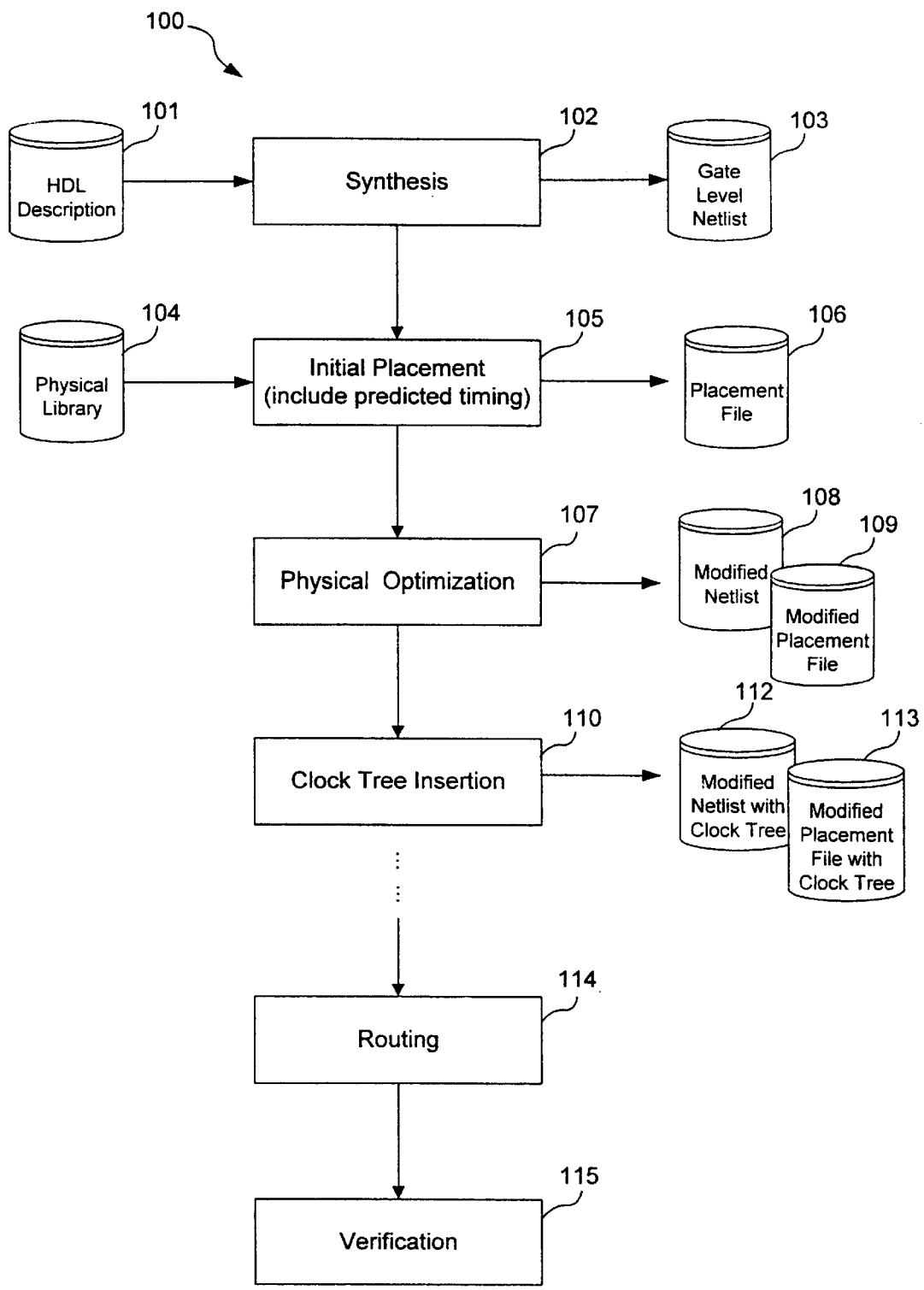
FIG. 1 shows a typical design process or a "design flow" that an integrated circuit designer would use to design a standard cell-based integrated circuit.

Returning to FIG. 5, clock tree 320 for integrated circuit design 290 has now been constructed. The clock tree insertion process is complete. At step 252, the buffers, including non-inverting buffers or inverters, can now be added to the netlist and the placement file. Clock tree insertion system 200 outputs a netlist 218 including the buffers of the clock tree and a placement file 220 including the buffers of the clock tree. The netlist and placement files are used in the subsequent design process for routing and verifying the design, as shown in FIG. 1.

Advantages

As described above, the H-tree methodology attempts to construct a clock tree with balance loading. The H-tree methodology relies on the wire distance as a proxy for load capacitance. By approximately balancing the wire distance between the root node to each endpoint, the capacitive loading of the tree branches is assumed to be balanced as well. In the manner, the H-tree balances the clock signal delay to each endpoint. However, as described above, the H-tree tree methodology is not satisfactory because balancing the wire distances does not always mean balancing the load.

In accordance with the present invention, the clock tree insertion system and method construct a clock tree by directly balancing the delay. The clock tree insertion system and method of the present invention realize numerous advantages not achievable by conventional clock tree methodologies.

First, because the clock tree is constructed by evaluating the clock signal delays rather than using a proxy for the delay, such as wire length, the clock tree insertion system and method can be used to construct a clock tree that meets tighter timing constraints.

More importantly, the clock tree constructed according the method of the present invention can be made faster (higher operating frequency) than clock trees constructed using conventional methods, such as the H-tree methodology, because the method of the present invention does not introduce dummy loads in constructing the clock tree. The use of the dummy loads for load balancing in the conventional H-tree methodology adds to the total loading the clock tree has to drive, thus slowing down and limiting the frequency of the clock signal.

A clock tree constructed in accordance with the method of the present invention provides reasonable stability across manufacturing and operational environment variations. Thus, the clock tree provides predictable delays, thereby improving the robustness of the integrated circuit design. Furthermore, the stability can be achieved "at speed" —i.e., at the operating frequency of the integrated circuit design.

A clock tree constructed using the system and method of the present invention uses optimally sized buffers at optimally placed insertion point. The clock tree thus requires less silicon area to implement and consumes less power.

In summary, the clock tree insertion system and method of the present invention can be applied in integrated circuit designs to build a robust clock tree, especially for designs employing the deep sub-microns or below fabrication technologies.

Zero-Skew Buffer Insertion Point Computation

In constructing a clock tree in accordance with the clock tree insertion method of the present invention (step 246 of FIG. 5), a clustering operation is performed and in each cluster, whether comprising of clock endpoints or buffers at a lower level of the clock tree, a buffer insertion point is determined for positioning a buffer for driving the clustering nodes in the cluster (step 282 in FIG. 8). A traditional method for determining the buffer insertion point for a group of objects places the insertion point at the geometric center of the area occupied by the objects. For example, in the H-Tree methodology discussed above, the integrated circuit design is divided into regions and the geometric center of each region is used as the buffer insertion point for that region. The geometric center is the arithmetic mean of the distances from the buffer insertion point to all endpoints within a region. Other traditional methods involve using iterative computation to search for a position that balances the clock skew to all of the endpoints. However, the traditional methods are generally not satisfactory, particularly when the region of interest is large. The traditional methods may give a buffer insertion point which has a larger than necessary delay time or may result in a large local clock skew within the region.

According to one aspect of the present invention, the buffer insertion point for each cluster is positioned at a "zero-skew" point within a cluster. In accordance with the present invention, a zero-skew point within a cluster is the position in an area occupied by the cluster where the insertion of the buffer gives the smallest local clock skew for the cluster. That is, the zero-skew point minimizes the spread of the arrival times for the clustering nodes within the cluster.

In accordance with the present invention, a method for computing a zero-skew buffer insertion point in a cluster involves applying minimization of the variance to a function describing the distance from each clustering node to the buffer insertion point. By minimizing the variance of the distances from the clustering nodes to the buffer insertion point, the variance of the arrival times is also minimized. The method for computing a zero-skew buffer insertion point will now be described. For the purpose of the present description, an integrated circuit design (such as design 290 in FIG. 9a) is assumed to be on a Cartesian plane with the origin of the position coordinates at the lower-left corner of the design. Any position within the integrated circuit design can be assigned an coordinate (x, y). The coordinate for the zero-skew buffer insertion point will be denoted as $(X_b, Y_b)$.

First, given a cluster of N clustering nodes, a function describing a distance d from each clustering node to the position $(X_b, Y_b)$ of the zero-skew insertion point is written. In the Euclidean distance metric, the function $f(d_i)$ is expressed as follows:

$$f(d_i) = \sqrt{(x_i - x_b)^2 + (y_i - y_b)^2}, \quad \text{Eq. (1)}$$

where $(x_i, y_i)$ denotes the coordinate of any clustering node i in the cluster of N clustering nodes. For the rectilinear distance metric, the function $f(d_i)$ is expressed as follows:

$$f(d_i) = |(x_i - x_b)| + |(y_i - y_b)|. \quad \text{Eq. (2)}$$

Next, the equation for computing the variance is applied to the function $f(d_i)$ as follows:

$$(N-1)\sigma = \Sigma(f(d_i))^2 - 1/N(\Sigma f(d_i))^2 \quad \text{Eq. (3)}$$

Then, minimization of the variance to the function $f(d_i)$ is applied by taking the first derivative of Equation (3) with respect to the distance d and setting the first derivative to zero. The position coordinate $(x_b, y_b)$ for the buffer insertion point is then solved for using the first derivative of Equation (3).

To verify that the solution based on the first derivative is indeed the minimum, the second derivative of Equation (3) is taken. If the second derivative is a positive value, then the solution based on the first derivative is a minimum point and the solution is validated. If the second derivative is a negative value, then the solution based on the first derivative is actually a maximum point and the solution is invalid.

By applying the function $f(d_i)$ for any distance metrics in Equation (3), the minimization of variance can be performed so as to obtain the equations for computing the zero-skew buffer insertion point. In the present description, an one-dimensional solution using the square of the Euclidean distance metric is obtained using the method of the present invention. The square of the Euclidean distance metric is the square of function f($d_i$) of Equation (1) above. The solution providing the coordinates for the buffer insertion point is as follows:

$$x_b = \frac{0.5 \times (M1 \times M2 - N \times M3)}{(M1 \times M1 - N \times M2)}, \quad \text{Eq. (4)}$$

$$y_b = \frac{0.5 \times (M1 \times M2 - N \times M3)}{(M1 \times M1 - N \times M2)}, \quad \text{Eq. (5)}$$

where Mk in Equation (4) is the $k^{th}$ moment of x with respect to zero, Mk in Equation (5) is the $k^{th}$ moment of y with respect to zero, and N is the number of clustering nodes in the cluster. The moments Mk for the x dimension are given as follows:

$$M1 = \sum_{i=1}^{N} x_i, \quad M2 = \sum_{i=1}^{N} x_i^2, \quad M3 = \sum_{i=1}^{N} x_i^3.$$

The moments Mk for the y dimension are given as follows:

$$M1 = \sum_{i=1}^{N} y_i, \quad M2 = \sum_{i=1}^{N} y_i^2, \quad M3 = \sum_{i=1}^{N} y_i^3.$$

Equations (4) and (5) above give the solution for computing the zero-skew buffer insertion point for an one-dimensional Euclidean space. Solutions for computing the zero-skew buffer insertion point using other distance metrics, such as the rectilinear space or a hybrid of Euclidean and rectilinear space, can also be expressed. Furthermore, two-dimensional solution can also be obtained. Equations (4) and (5) above give two separate one-dimensional solutions for the x and y dimensions. The one-dimensional solutions may contain errors due to some cross-term between the x and y dimensions not accounted for in the solutions. In most applications, the one-dimensional solution is adequate for computing a satisfactory zero-skew point. However, a two-dimensional solution can be derived if elimination of cross-term errors is desired.

When Equations (4) and (5) are used to compute the zero-skew buffer insertion point for a cluster, the computation can be performed using a Cartesian coordinate system with the origin at the lower-left corner of the integrated circuit design. In another embodiment, scaling of the position coordinates (x, y) can be continuously applied so that the cube of the position coordinates does not exceed the maximum signed floating point number representable by the computing machine. For example, the maximum signed floating point number that can be represented by a 32-bit computer is approximately $10^{38}$. Thus, during the computation of the zero-skew buffer insertion point of the present invention, scaling can be applied to keep the cube of any position coordinates to less than $10^{38}$.

The method for computing a zero-skew buffer insertion point of the present invention has applications beyond clock tree construction. In general, the method of the present invention can be used to determine the zero-skew insertion point for positioning a driver in an area occupied by nodes that are to be driven by the driver. The driver can be a buffer, an inverter, or any other logic gates, such as a NAND gate or a NOR gate). The nodes can be input pins of logic gates receiving a signal generated by the driver. The method of the present invention can be used to compute the zero-skew driver insertion point so that the spread of the signal arrival times at the nodes is minimized.

Match-Delay Buffer Insertion

In the clock tree insertion method of the present invention, a clock tree is constructed to be as fast as possible and then the clock tree is slowed down by adding delays at the fastest nodes in order to meet min delay and max skew timing constraints. The traditional methods for adding delay to a node involves adding a buffer having the desired delay value or resizing the buffer at the node. The traditional methods for adding delay often result in a change in the load capacitance to the previous stage. For example, if a buffer having a smaller size then the current buffer is added to introduce the desired amount of delay, the input capacitance as seen by the node upstream to the newly added buffer is now changed. In fact, the input capacitance as seen by the upstream node is decreased and the delay at the upstream node is decreased because the buffer at the upstream node only needs to drive a smaller capacitance.

Consequently, in an effort to add a delay at the current node to slow down the clock tree, the addition of delays may actually result in making the clock tree faster at other nodes of the clock tree. The changing of the input capacitance of the previous stage and the resultant speeding up of the clock tree can have a ripple effect throughout the clock tree. Therefore, the traditional methods for adding delays is undesirable because clock tree construction tends to converge very slowly as new delay problems are created when existing problems are being solved.

According to another aspect of the present invention, a method for "match-delay" buffer insertion is provided to add delays at a node without changing the input capacitance of the node as seen by the upstream node (or the parent node). When delays are to be added to buffers in the clock tree for meeting min delay and max skew timing constraints, optimally sized buffers are added at optimal locations so that the capacitive loading to the previous stages (the parent stages) remains the same or changes only minimally. In this manner, the clock tree insertion process avoids introducing new timing violations while trying to cure existing violations. The match-delay buffer insertion method allows the clock tree insertion process to coverage more rapidly for constructing a clock tree meeting timing constraints.

Figure 19:
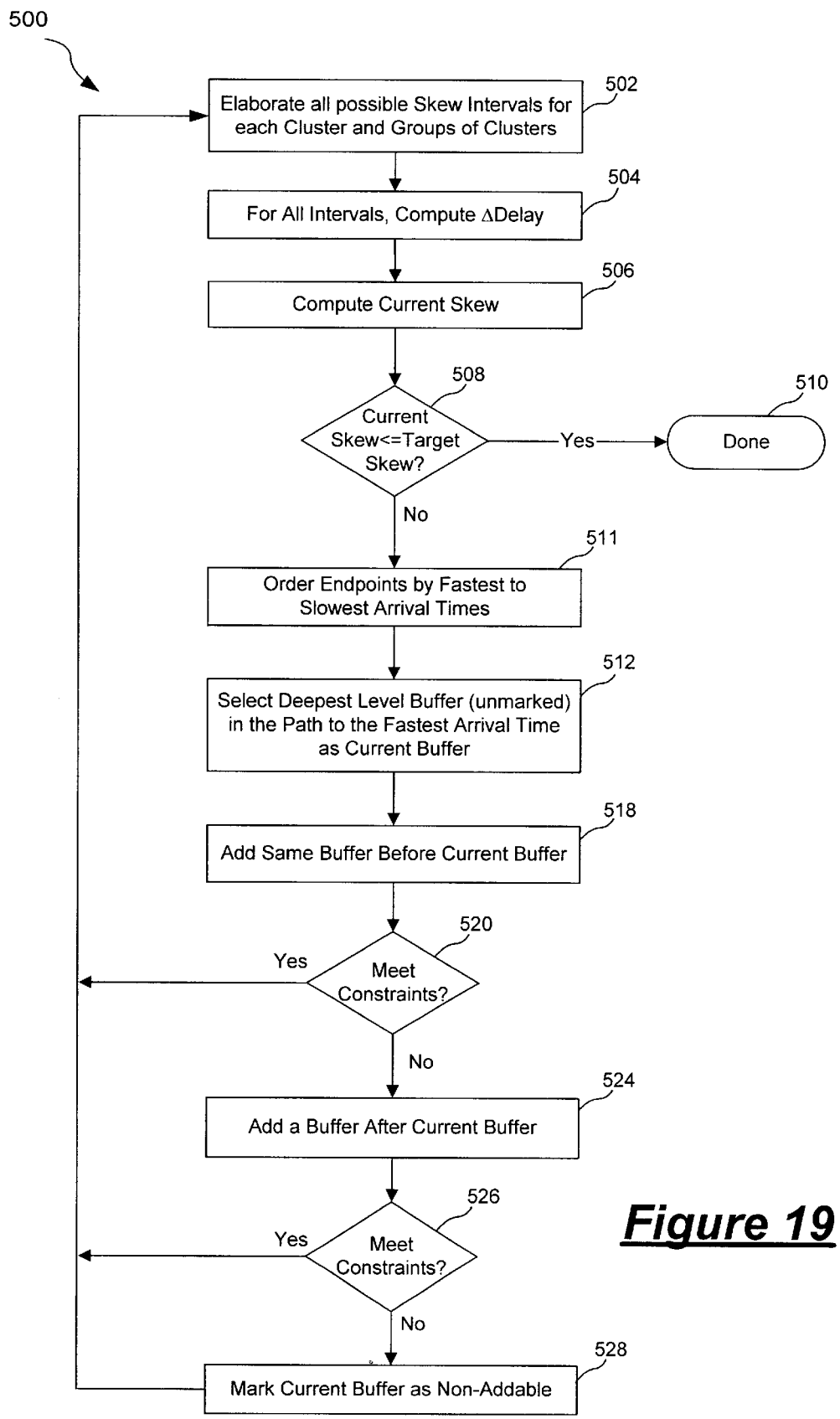
FIG. 19 is a flowchart illustrating the match-delay buffer insertion method according to one embodiment of the present invention.

FIG. 19 is a flowchart illustrating the match-delay buffer insertion method according to one embodiment of the present invention. In the present embodiment, match-delay buffer insertion method 500 is applied to correct clock skew violations and is performed prior to step 402 of clock skew correction process 400 of FIG. 15. When match-delay buffer insertion method 500 is included in the clock tree insertion method of the present invention, method 500 is used to correct large delay violations while leaving the minor delay violations for clock skew correction process 400 to correct. Specifically, match-delay buffer insertion method 500 uses only addition of buffers for introducing large delay values and do not use other methods, such as resizing the current buffers or repositioning the current buffers, to add delays. Subsequently, process 400 uses resizing and repositioning to introduce small delay values to fine tune the clock skew correction. The operation of the match-delay buffer insertion method will be explained with reference to clock tree 320 in FIG. 11.

Referring to FIG. 19, steps 502 to 510 of method 500 are the same as steps 402 to 410 of process 400 of FIG. 15. However, after method 500 determines that there is a clock skew violation (step 508), that is, the current skew is greater than the max skew constraint, method 500 does not apportion the ΔDelays as in process 400. Rather, method 500 proceeds to order the endpoints by the fastest to slowest arrival times (step 511). Then, method 500 performs a depth-first sweep of the buffers in the buffer tree, selecting the deepest buffer level in the path to the clock endpoint of the fastest arrival time. The selected buffer should be one that is "unmarked." At the commencement of method 500, all buffers in clock tree 320 are unmarked. The criteria for marking a buffer in method 500 will be explained in more detail below with reference to step 528. In the present example, buffer 322 being the buffer at the deepest level of the fastest node, will be selected at step 512 as the current buffer.

Having selected the current buffer for introducing delay, method 500 proceeds to add delays without changing the input capacitance. At step 518, method 500 first attempts to add a buffer that is the same as the current buffer just before the current buffer. By adding the same buffer as the current buffer, the upstream node (root node 293 in FIG. 11) will see the same input capacitance and thus the delay at the upstream node will not change. At step 520, method 500 determines if the addition of the same buffer before the current buffer corrects the clock-skew violation and that the current node, as corrected, meets the timing constraints. If so, addition of buffer is successful and method 500 returns to step 502 for correcting timing violations at other nodes.

If addition of a buffer before the current buffer is not successful in correcting the clock skew violations or causes other timing violations (step 520), method 500 proceeds to add a buffer after the current buffer (step 524). In the present embodiment, method 500 tries all buffers in the buffer set to find a buffer which can be added after the current buffer for correcting the clock skew violation. The buffer added may be of a dissimilar size than that of the current buffer. But since the new buffer is added after the current buffer, the input capacitance as seen by the upstream node remains unchanged. If the addition of the buffer after the current buffer is successful in curing the clock skew violation and the current node, as corrected, meets the timing constraints (step 526), method 500 returns to step 502 to correct clock skew violations at other nodes. If the addition of the buffer after the current buffer is unsuccessful, then the current buffer is marked as "non-addable" indicating that the delay cannot be introduced at this buffer by adding a new buffer. Instead, the "non-addable" buffers will be corrected at process 400 where delays can be added by resizing the buffer or repositioning the buffer.

FIGS. 20*a* and 20*b* illustrate the operation of the match-delay buffer insertion method of the present invention in adding delays to a current buffer without changing the load as seen by the parent node. Referring to FIG. 20*a*, step 518 of method 500 introduces delays by adding a new buffer 530 that is of the same buffer type as current buffer 532 just before the current buffer. The physical location of new buffer 530 is chosen to be as near the physical location of current buffer 532 as possible to avoid changing the wire capacitance. In the manner, the parent node to current buffer 532 will see almost the same input capacitance after the addition of new buffer 530.

Referring to FIG. 20*b*, step 524 of method 500 introduces delays by adding a new buffer 534 after current buffer 532. New buffer 534 may be of a different buffer type than current buffer 532. Because the parent node to current buffer 532 sees the same buffer 532, the input apacitance as seen by the parent node is unchanged. To add given delay, new buffer 534 can be a larger buffer than the current buffer or a smaller buffer than the current buffer. Adding a larger or smaller new buffer after the current buffer may change the loading of the current buffer and accordingly changes the delay of the current buffer. Therefore, step 524 steps through all the buffers in the buffer set and selects a combination of current/new buffers which would give the desired delay amount.

After the operation of match-delay buffer insertion method 500, the clock insertion process of the present invention can return to clock skew correct process 400 of FIG. 15 for correcting any remaining clock skew violations. In accordance with the present invention, the match-delay buffer insertion method has the effect of curing timing violations requiring large delay insertions (e.g. greater than 100 pf). The large delay insertions are handled exclusively by adding buffers using the match-delay technique so that the input capacitance as seen by the parent nodes is not disturbed. Then, the remaining small scale timing violations can be corrected by using the resizing or repositioning techniques where small, incremental delays can be introduced.

The match-delay buffer insertion method of the present invention can also be applied for correcting other timing violations, such as min delay violations. For example, referring to FIG. 18, when min delay correction process 450 operates to add delays at the root node (step 454) or at the primary buffer levels just below the root node (step 462), process 450 can apply the match-delay buffer insertion method in adding delays. That is, steps 454 and 462 will first operate to add the same buffer as the target buffer before the target buffer (the target buffer refers to the root node or the primary buffer levels where delays are to be added). If the timing violation cannot be fixed by adding a matched buffer before the target buffer, then steps 454 and 462 will operate to add a buffer after the target buffer. All buffers in the buffer set will be tried to find a combination of the new buffer and the target buffer that would give the desired delay. If the match-delay technique cannot be used to cure the min delay violation, then process 450 will return to its default operation where delays can be added by resizing the target buffer or repositioning the target buffer.

In the above description, the match delay buffer insertion method is applied for introducing delays in a clock tree constructed using buffers and inverters. The match delay buffer insertion method of the present invention can have other applications in the design of an integrated circuit. In general, the match delay buffer insertion method can be used to introduce delays in any part of an integrated circuit delay where preservation of the input capacitance is desired. Thus, the match delay buffer insertion method can be used for introducing delays using logic gates other than buffers and inverters. For instance, if a delay is to be added to an NAND gate, the match delay buffer insertion method will first try to add the same NAND gate before the target NAND gate to introduce the desired delay. If adding an NAND gate before the target gate does not work, then the match delay buffer insertion method will add a delay using any logic gate after the target NAND gate. In this manner, the input capacitance of the target NAND gate can remain unchanged as delay is being added.

Optimal Driver Selection

In constructing a clock tree in accordance with the clock tree insertion method of the present invention (step 246 of FIG. 5), clustering operations are performed repeatedly to group clock endpoints or buffers into clusters. In each cluster, a buffer insertion point is determined (step 282 of FIG. 8) and a buffer capable of driving the nodes within the cluster is selected (step 283 of FIG. 8). Typically, the buffer is selected from a list of candidate buffers defined by the user or selected by default by the clock tree insertion system.

The buffer selection process in the clock tree insertion method can be generalized to the process of selecting a driver in a logic chain of drivers. The drivers can be buffers or inverters or logic gates such as NAND or NOR gates. The logic chain can be part of a clock tree, a phased locked loop, or any part of an integrated circuit design, such as a part of a decoder circuit. In any case, the driver selection process involves selecting a driver which can drive the predetermined capacitive load within predetermined timing constraints. In some cases, in building a logic chain, a driver is preslected and it is necessary to determine the amount of load that can be effectively coupled to the driver without violating predetermined timing constraints.

Mead and Conway describes one traditional method for selecting the optimal driver for driving a large capacitive load. (See "Introduction to VLSI Systems" by C. Mead and L. Conway, Addison-Wesley Publishing Company, 1980, pages 10–14.) In the traditional method, to drive a capacitive load $C_L$, a chain of increasingly sized drivers (buffers or inverters) is used where the last driver is large enough to drive the load capacitance $C_L$ directly. In a chain of buffers, the delay through one stage of the chain is given as $\alpha\tau$, where a is the fanout factor for the buffer and $\tau$ is the delay time of the first buffer in the buffer chain. Typically, the delay time $\tau$ is modeled as RC, that is, the product of the output resistance of the stage driving the first buffer and the input capacitance of the first buffer. For a chain of N buffers, each stage having a fanout factor of $\alpha$, the total delay $D_T$ for the entire buffer chain is given as:

$$D_T = N\alpha RC, \text{ and} \quad \text{Eq. (6)}$$

$$\alpha^N = \frac{C_L}{C_{IN}}, \quad \text{Eq. (7)}$$

where $C_L$ is the load capacitance driven by the chain of buffers and $C_{IN}$ is the input capacitance of the first buffer stage. By solving for N in Equation (7), the total delay $D_T$ can be written as:

$$D_T = \alpha RC \frac{\ln Cg}{\ln \alpha}, \quad \text{Eq. (8)}$$

where Cg is $C_L/C_{IN}$, which is the capacitive gain of the entire buffer chain.

Mead and Conway concluded that to minimize the total delay $D_T$, a fanout factor of e (2.718) should be used for each stage. Thus, in the traditional buffer selection method based on the analysis provided by Mead and Conway, a buffer having a fanout factor of e is selected to drive each stage of the buffer chain.

While the Mead and Conway solution provides a mathematically correct method for selecting buffers to build a chain of buffers so that the total delay is minimized, the Mead and Conway solution has shortcomings in practice. In actual implementation, the fanout factor of e predicted by Mead and Conway works well only for non-submicron NMOS technologies. As technologies advance to CMOS and to submicron technologies, the Mead and Conway solution no longer applies. In fact, for submicron CMOS technologies, the fanout factor of e (2.718) is an incorrect value for minimizing total delay. In practice, designers using SPICE simulation or test chip have discovered that a fanout factor of 4–6 should be used to minimized total delay. However, no closed-formed solution for determining the fanout factor for submicron CMOS technologies have been developed and designers often rely on SPICE simulation and test chips to determine the optimal fanout factor for use in the particular technology of interest.

Another shortcoming of the traditional buffer selection method based on the Mead and Conway solution concerns the use of the "RC" model for the buffer delay $\tau$. The RC model for delay is a linear approximation which is not very accurate in practice. Delay through a logic gate is not strictly the product of the output resistance (of the previous stage driving the logic gate) and the input capacitance (of the logic gate). In fact, the buffer delay has a non-linear characteristic with respect to the output resistance and the input capacitance. Also, the linear RC model does not take into account the intrinsic delay of the buffer. Thus, a buffer chain constructed using the linear RC approximation for delay is often slower than desired.

According to one aspect of the present invention, a method for optimal driver selection is provided for selecting an optimal driver for driving a predetermined capacitive load. The optimal driver selection method uses a cost function that is based on the non-linear delay characteristics and the capacitive gain of the candidate drivers. The capacitive gain of a driver is defined as $C_{OUT}/C_{IN}$ where $C_{OUT}$ is the output capacitance driven by the river and $C_{IN}$ is the input capacitance of the driver. The cost function operates to select an optimal driver for driving the predetermined capacitive load which simultaneously minimizes the delay and the amount of input capacitance introduced. In practice, the cost function operates to select a driver by balancing the benefits from a shorter delay with benefits from a faster edge rate. According to another aspect of the present invention, the method for optimal driver selection can be applied in selecting an optimal load for a driver. The use of the method of the present invention for optimal load selection will be described in more detail below.

In accordance with the present invention, a cost function C for optimal driver selection is given as:

$$C = \frac{\text{Stage Delay}}{\ln \alpha}, \quad \text{Eq. (9)}$$

where Stage Delay is the delay of a candidate driver and $\ln\alpha$ denotes the natural logarithm of the stage gain or the fanout factor of the driver. In the present embodiment, the stage gain of the driver is expressed as the capacitive gain ($C_{OUT}/C_{IN}$) of the driver. Thus, Equation (9) can be expressed as:

$$C = \frac{\text{Stage Delay}}{\ln\left(\frac{C_{OUT}}{C_{IN}}\right)}. \quad \text{Eq. (10)}$$

The cost function of the present invention is based on Equation (8) describing the total delay $D_T$ of a logic chain. In Equation (8), the total delay is a function of the stage delay ($\alpha RC$) and an inverse function of logarithm of the fanout factor ($\alpha$). The term ln (Cg) is a constant describing the capacitive gain of the entire logic chain.

The inventor of the present invention recognizes that in order to minimize the total delay $D_T$ of a logic chain, an optimal driver for each stage should have a small stage delay but a large logarithm of the stage gain. Therefore, the cost function of Equation (10) is derived to select a driver with the best delay value over the logarithm of the stage gain. In essence, the cost function of the present invention selects the fastest driver with the minimum input capacitance so that the new driver introduces an input capacitance that is as small as possible. By using the cost function of the present invention, a very fast logic chain can be constructed having minimum delay and introducing minimum capacitance to the integrated circuit.

In the present embodiment, the stage delay values of the candidate drivers are obtained from look-up tables in the cell library of the candidate drivers. Because the cell library contains delay values which are determined from empirical data, taking into consideration non-linear delay characteristics and intrinsic delay values, the stage delay values used in the cost function computation is more accurate than the traditional methods using a linear approximation of the driver's delay.

In one embodiment of the present invention, the optimal driver selection method operates by first computing the cost function C for all the drivers in the driver set. The driver set can be specified by the designer or chosen by default by the cell library. The optimal driver selection method then selects the driver with the minimum cost computed based on the cost function. In another embodiment, instead of computing the cost function for all the drivers in the driver set, the method computes the cost function for a first driver and then performs a minimization routine for finding the driver with the minimum cost. Computational methods for minimizing a function (minimization routines) are well known in the art and any such routine can be used in the optimal driver selection method of the present invention.

In yet another embodiment of the present invention, the optimal driver selection method uses a precomputed table for each driver containing cost values over a range of stage gain values or over a range of load capacitance ($C_{OUT}$) values. The precomputed tables can be generated by the optimal driver selection method of the present invention or the tables can be provided in the cell library as a standard set of parameters defining each cell in the cell library. To compute the cost function for a given set of drivers, the optimal driver selection method performs a table look-up operation using the predetermined output capacitance $C_{OUT}$ value. Interpolation of the table values can be performed if the exact $C_{OUT}$ value is not provided in the pre-computed table. When the look-up table contains cost as a function of the stage gain, a computation of the stage gain using the output capacitance $C_{OUT}$ value is first performed before the table look-up operation.

The operation of the optimal driver selection method will now be explained by way of an example. Assume that a buffer is to be selected to drive a load capacitance of $C_x$ and the buffer set contains two buffers B1 and B2, the optimal driver selection method performs a table look-up operation to retrieve the electrical characteristics of the two buffers from the cell library. Assume that buffers B1 and B2 have the following electrical characteristics:

| Buffer | $C_{IN}$ | Delay |
|---|---|---|
| B1 | $0.9C_x$ | 10 |
| B2 | $0.1C_x$ | 100 | where the input capacitance $C_{IN}$ is expressed in terms of the load capacitance $C_x$ and the delay is expressed as a generic values without unit for ease of illustration. In actual implementation, the input capacitance and the delay for the buffers will be expressed in units commonly used, such as pico-farad and nano-second, respectively. Having obtained the electrical characteristics of buffers B1 and B2, the cost function for each buffer can be computed using $C_x$ as the output capacitance $C_{OUT}$. The costs for buffers B1 and B2 are computed as follows:

$$Cost(B1) = \frac{10}{\ln\left(\frac{C_x}{0.9C_x}\right)} = 95; \text{ and}$$

$$Cost(B2) = \frac{100}{\ln\left(\frac{C_x}{0.1C_x}\right)} = 43.4.$$

The cost for buffer B2 is less than buffer B1, therefore buffer B2 is selected by the optimal driver selection method of the present invention. In the present example, buffer B2 has a larger stage delay value than buffer B1 but buffer B2 has a smaller input capacitance than buffer B1. In other words, buffer B2 has a larger stage delay but provides a larger capacitive gain. In fact, buffer B2 has a 10 times capacitive gain while buffer B1 only has a 1.11 times capacitive gain. The cost function of the present invention balances the benefit of a short delay with the benefit of a larger capacitive gain (i.e., small input capacitance). In this example, the cost function selects a buffer with 10 times the capacitive gain, even though the buffer has 10 times the delay value as the other buffer.

The above example illustrates one embodiment of the optimal driver selection method of the present invention. In other embodiments, the cell library for buffers B1 and B2 may contain precomputed costs as a function of output capacitance $C_{OUT}$. Thus, the optimal driver selection method operates by indexing the precomputed values using capacitance $C_x$ and retrieving the cost of the buffer. Interpolation of table values may be performed to obtain the cost of the buffer for an output capacitance of $C_x$. In another embodiment, the cell library for buffers B1 and B2 may contain precomputed costs as a function of the capacitive gain ($C_{OUT}/C_{IN}$). In that case, the optimal driver selection method computes the capacitive gain for each buffer and uses the capacitive gain values to index the pre-computed table to retrieve the cost for the buffer.

The application of the cost function of the present invention in the selection of an optimal driver has many advantages. First, the cost function is applied to trade-off delay and input capacitance optimally in the selection of a driver so that a logic chain can be constructed as fast as possible while the total capacitance for the logic chain is made as small as possible. That is, by selecting a driver with the best delay (smallest delay value) and the largest stage gain (largest capacitive gain), the cost function selects a driver that is fast and introduces the smallest capacitance.

Second, the cost function is applied to ensure that, when a driver is selected, the capacitance presented to the parent stage driving the driver is the smallest capacitance possible while maintaining the best delay performance. Presenting the smallest capacitance to the parent stage is particularly important when the driver of the parent stage is not yet determined. If a first buffer in the chain is selected so that the capacitance presented to the parent stage is too large, it may become impossible to find a second buffer which can drive the first buffer within the predetermined timing constraints. Referring to the example above, the larger capacitive gain (or the smaller input capacitance) of buffer B2 means that the parent stage driving buffer B2 only needs to drive a small capacitance value, as compared to the capacitance value of buffer B1. Therefore, buffer B2 is preferred over buffer B1.

Third, the optimal driver selection method of the present invention provides more accurate driver selection results than the traditional methods because the method of the present invention uses actual delay values for the drivers, as opposed to a linear approximation used in the traditional methods. Also, the result is more accurate because the method of the present invention numerically minimizes the cost function for the candidate drivers in the driver set. The method of the present invention does not rely on precomputed fanout factor which is generally applicable for the technology but not specifically computed for the drivers of interest.

The optimal buffer selection method of the present invention has many applications. In one embodiment, the optimal driver selection method is applied to the clock tree insertion method of the present invention for selecting a buffer to drive nodes that are grouped into a cluster. The load capacitance for the buffer can be determined from the number of nodes within the cluster and the input capacitance of each of the nodes. In one embodiment, the cost function is computed for each buffer in the buffer list specified for use by the clock tree. In another embodiment, the cost is retrieved by a table look-up operation using the load capacitance to index the precomputed cost versus load capacitance table for each buffer. The buffer with the smallest cost is selected as the buffer to drive the cluster. By applying the optimal driver selection method to the selection of buffers in the clock tree insertion method of the present invention, a clock tree with minimized maximum insertion delay can be constructed. Also, in the clock tree insertion process, at each stage where a buffer is selected for driving a cluster, the parent stage is not yet determined. The optimal driver selection method chooses a buffer with the smallest input capacitance possible to ensure that the parent stage will see the smallest load possible.

In another embodiment, the optimal driver selection method is applied to determine the size of a logic gate for use in a chain of logic. For example, in a given chain of logic, the optimal driver selection method can be used to determine the size of a logic gate to be used to drive a given load. The optimal driver selection method is applied to ensure that the selected logic gate minimizes the delay while keeping the input capacitance introduced to the parent stage as small as possible. For example, in a chain of NAND gates, it is necessary to determine the size of a first NAND gate in the chain driving a load capacitance $C_L$. The cost function is applied to the NAND gates in the cell library to find the NAND gate with the smallest cost. In computing the cost function, the stage delay is the delay of the critical path through the NAND gate. For example, if the "A" input pin of the NAND gate is in the critical path, the delay from "A" to the output of the NAND gate is used as the stage delay. The input capacitance of input pin "A" is used as the input capacitance $C_{IN}$ of the cost function. In this manner, a NAND gate of the appropriate size is selected where the NAND gate has the minimum delay and the smallest input capacitance.

In yet another embodiment, the optimal driver selection method is applied for optimal load selection. That is, the optimal load selection method applies the cost function to determine the optimal load a given logic gate can drive while maintaining the best delay performance. For instance, in an integrated circuit design, a preselected logic gate has to drive a large fanout. The optimal load selection method is applied to determine how much load each logic gate can drive so that the appropriate number of the preselected logic gate can be included for driving the large fanout. In another example, in constructing a clock tree, if the clock tree specification includes only one buffer type in the buffer list available to build the clock tree, then the optimal load selection method is applied to determine the amount of nodes each buffer can drive in the clock tree.

In operation, the optimal load selection method is applied for a selected logic gate. The optimal load selection method uses the precomputed cost versus $C_{OUT}$ table for the selected logic gate in the cell library. From the cost versus $C_{OUT}$ table, the optimal load selection method selects the output capacitance $C_{OUT}$ value which gives the minimum cost. Interpolation of the table values may be needed to determine a $C_{OUT}$ with minimum cost. The output capacitance value $C_{OUT}$ can then be used as the desired load selected for the selected logic gate.

The above detailed descriptions are provided to illustrate specific embodiments of the present invention and are not intended to be limiting. Numerous modifications and variations within the scope of the present invention are possible. For instance, while the flowcharts in the figures of the present invention illustrate certain process sequence, one of ordinary skill in the art, upon being apprised of the present invention, would know that some of the process sequence can be rearranged to achieve the same result. The process sequence in the flowcharts are illustrative only. The present invention is defined by the appended claims.

We claim:

1. A method for inserting a delay in a node in an electrical design at an output terminal of a logic gate whereby an input capacitance as seen by a parent node at an input terminal of said logic gate is maintained, said method comprising:

inserting a first new logic gate between said parent node and said input terminal of said logic gate, said first new logic gate being of the same cell type as said logic gate, having the same input capacitance in an input terminal corresponding to said input terminal of said logic gate, and being positioned near said logic gate to reduce wire capacitance between said first new logic gate and said logic gate; and determining if said delay is successfully added by said insertion; and if said delay is not successfully added by said insertion, adding said delay by, instead inserting said first new logic gate, inserting a second new logic gate at said output terminal of a said logic gate, a combination of said logic gate and said second new logic gate giving said delay to be added.

2. The method of claim 1, wherein said logic gate is a first buffer and said first new logic gate is a buffer of the same buffer type as said first buffer.

3. The method of claim 1, wherein said second new logic gate comprises logic gates of the same type as said logic gate.

4. The method of claim 1 wherein said second new logic gate comprises a logic gates of different type than said logic gate.

5. The method of claim 1, wherein said logic gate is a first buffer and said second new logic gate is a buffer of a dissimilar size than said first buffer.

* * * * *